United States Patent [19]

Kuramoto et al.

[11] Patent Number: 5,366,581
[45] Date of Patent: Nov. 22, 1994

[54] FILM PASTING APPARATUS

[75] Inventors: Takashi Kuramoto; Tetsuji Utsuda; Takeo Onga, all of Tokyo; Takashi Kominato, Kanagawa; Hidenori Kaneda, Tokyo; Mitsuo Taga, Kodaira, all of Japan

[73] Assignees: Toppan Printing Co., Ltd., Tokyo; Fuji Photo Film Co., Ltd., Minami-ashigara, both of Japan

[21] Appl. No.: 885,851

[22] Filed: May 20, 1992

[30] Foreign Application Priority Data

May 24, 1991 [JP] Japan .................. 3-120437
May 24, 1991 [JP] Japan .................. 3-120438
Sep. 27, 1991 [JP] Japan .................. 3-249882

[51] Int. Cl.$^5$ ............ B32B 35/00; G03B 27/52; G03B 27/04
[52] U.S. Cl. .................. 156/364; 156/365; 156/378; 156/379; 156/506; 156/510; 156/517; 156/521; 156/563; 156/573; 355/40; 355/75; 355/88; 271/121; 271/126
[58] Field of Search .................. 355/40, 75, 88; 156/364, 378, 379, 510, 506, 517, 521, 522, 563, 564, 573, 365; 271/121, 126

[56] References Cited

U.S. PATENT DOCUMENTS

| 4,426,152 | 1/1984 | Sakamoto et al. | 355/75 |
|---|---|---|---|
| 4,599,122 | 7/1986 | Nakamura . | |
| 4,916,482 | 4/1990 | Nishida et al. | 355/75 |
| 5,026,042 | 6/1991 | Miller | 271/121 X |
| 5,044,622 | 9/1991 | Cattin | 271/121 |
| 5,095,330 | 3/1992 | Nishida et al. | 355/75 |

FOREIGN PATENT DOCUMENTS 348908 3/1989 European Pat. Off. .
3533176 3/1986 Germany .

Primary Examiner—David A. Simmons
Assistant Examiner—M. Curtis Mayes
Attorney, Agent, or Firm—Burns, Doane, Swecker & Mathis

[57] ABSTRACT

A film pasting apparatus for pasting a color separation film on a base film used for a photomechanical process, comprises a lower table for placing a base film and having optical sensors, an upper table disposed above the lower table and having suction means and pasting means, a film tray for storing a color separation film on which a first registration mark having two line segments defining a predetermined angle and a second registration mark having two line segments parallel to the two line segments of the first registration mark are formed at positions corresponding to the sensors, film picking means for inserting the film tray into the apparatus main body below the upper table to draw the color separation film to the upper table by the suction means, film registering means for withdrawing the film tray from the apparatus to detect the registration marks of the color separation film drawn to the upper table by using the sensors, for registering the color separation film based on a result of detection of the registration marks, and for placing the color separation film on the base film placed on the lower table, and means for operating the pasting means to paste the color separation film on the base film.

35 Claims, 22 Drawing Sheets

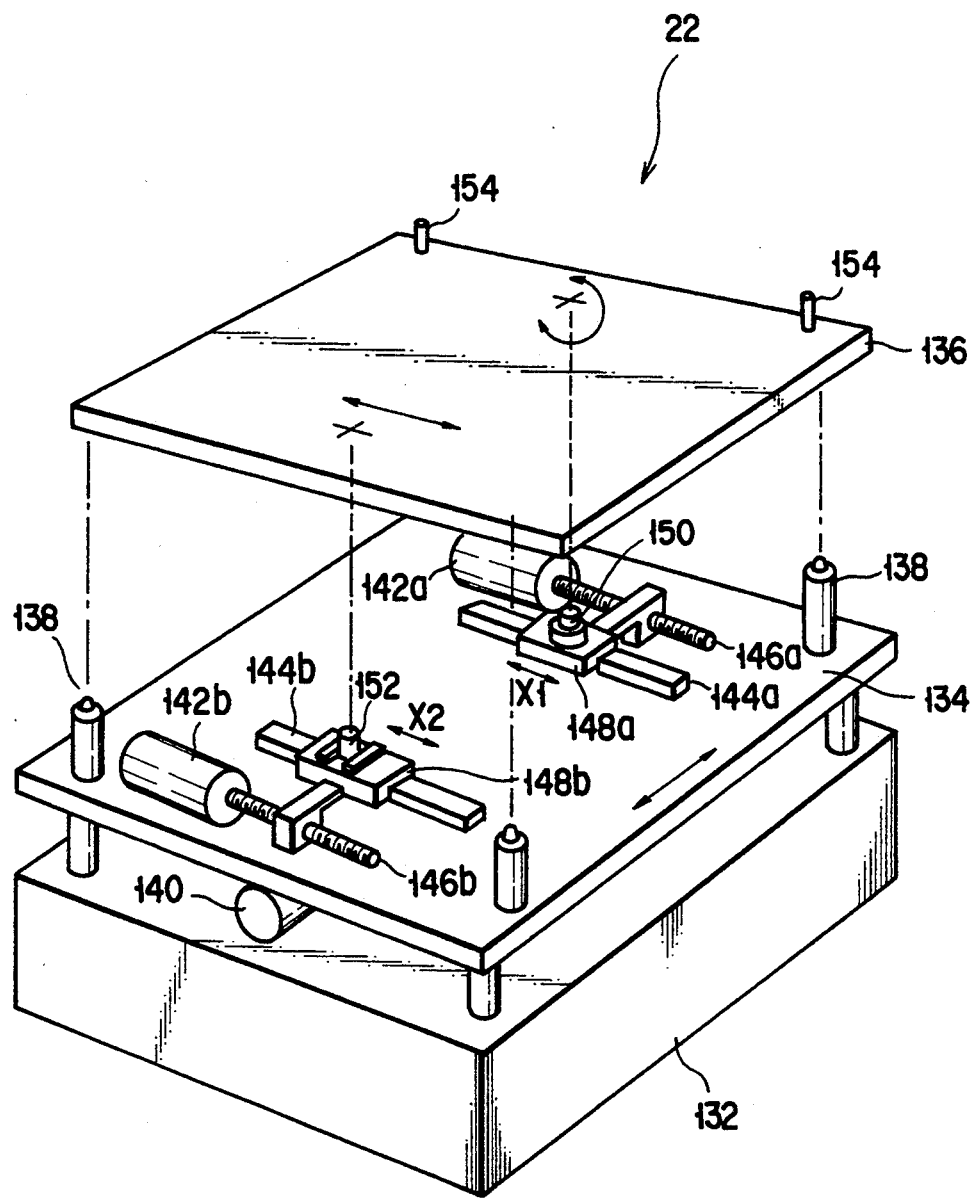
F I G. 4

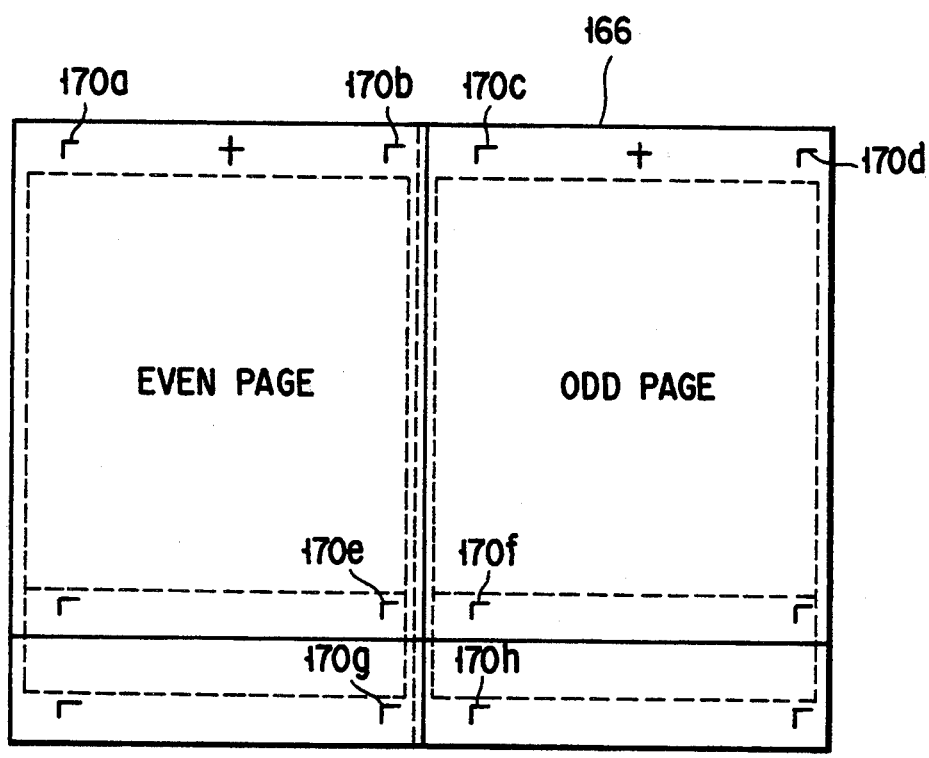
F I G. 5

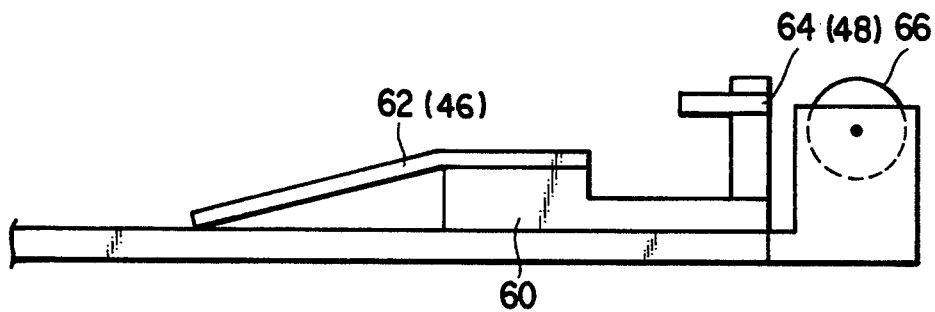
F I G. 14
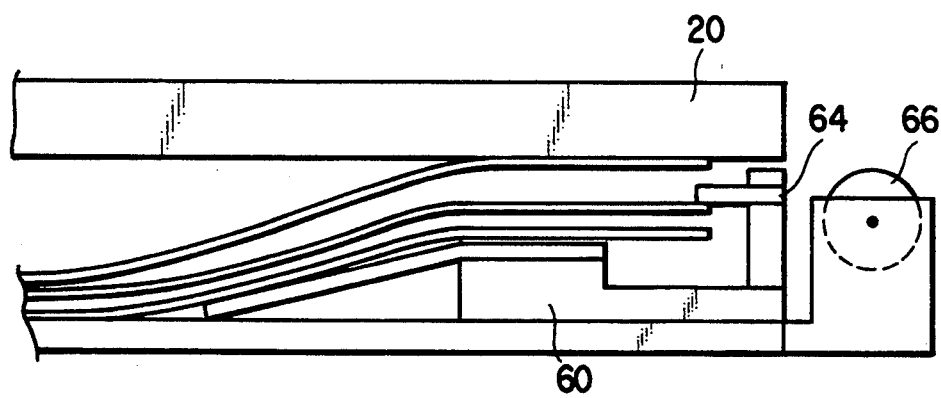
F I G. 15A
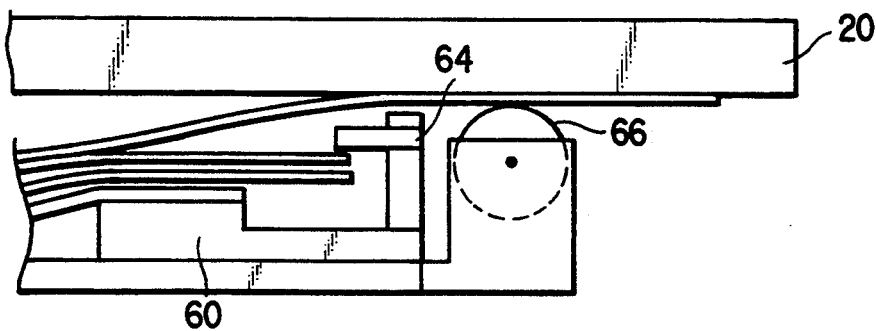
F I G. 15B

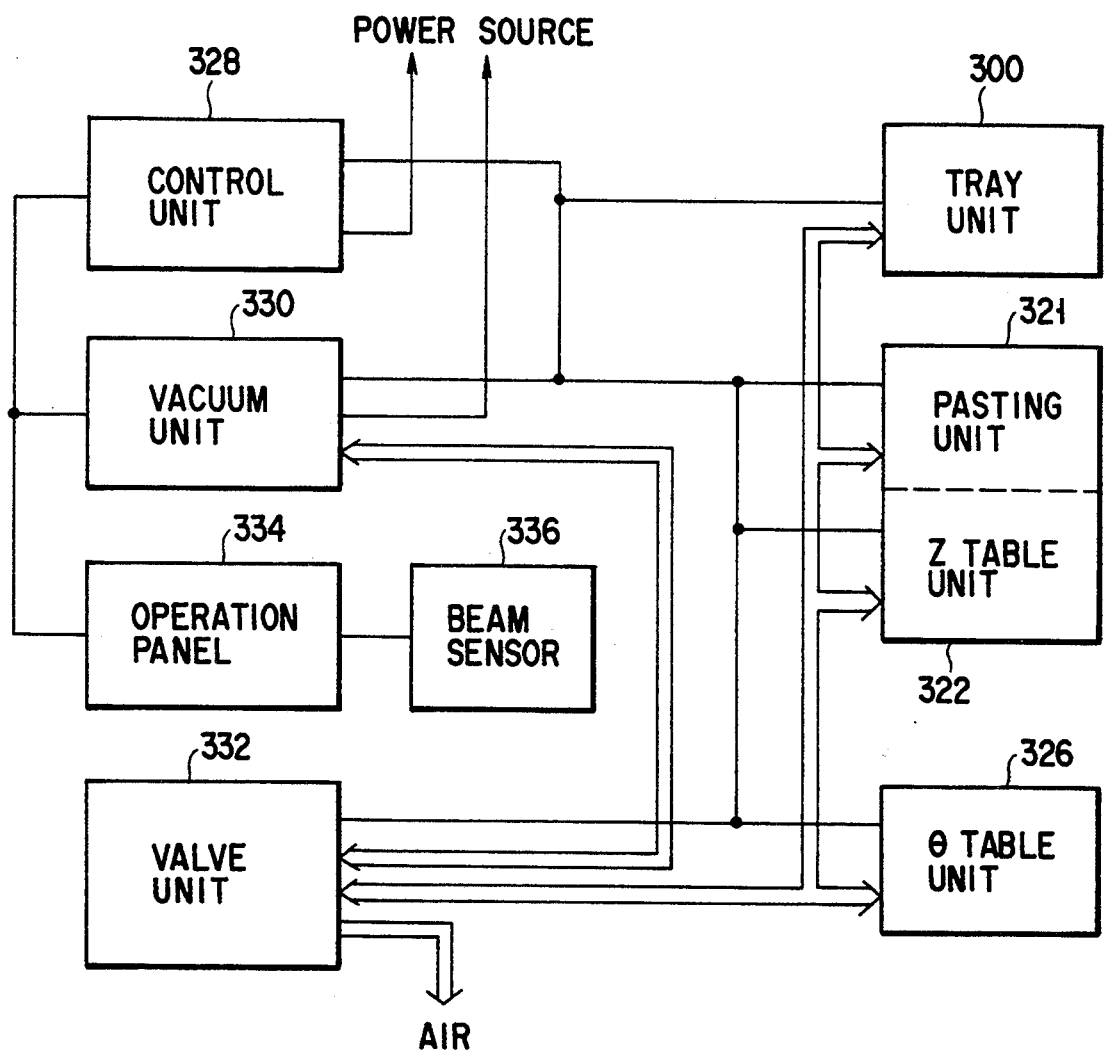
F I G. 23

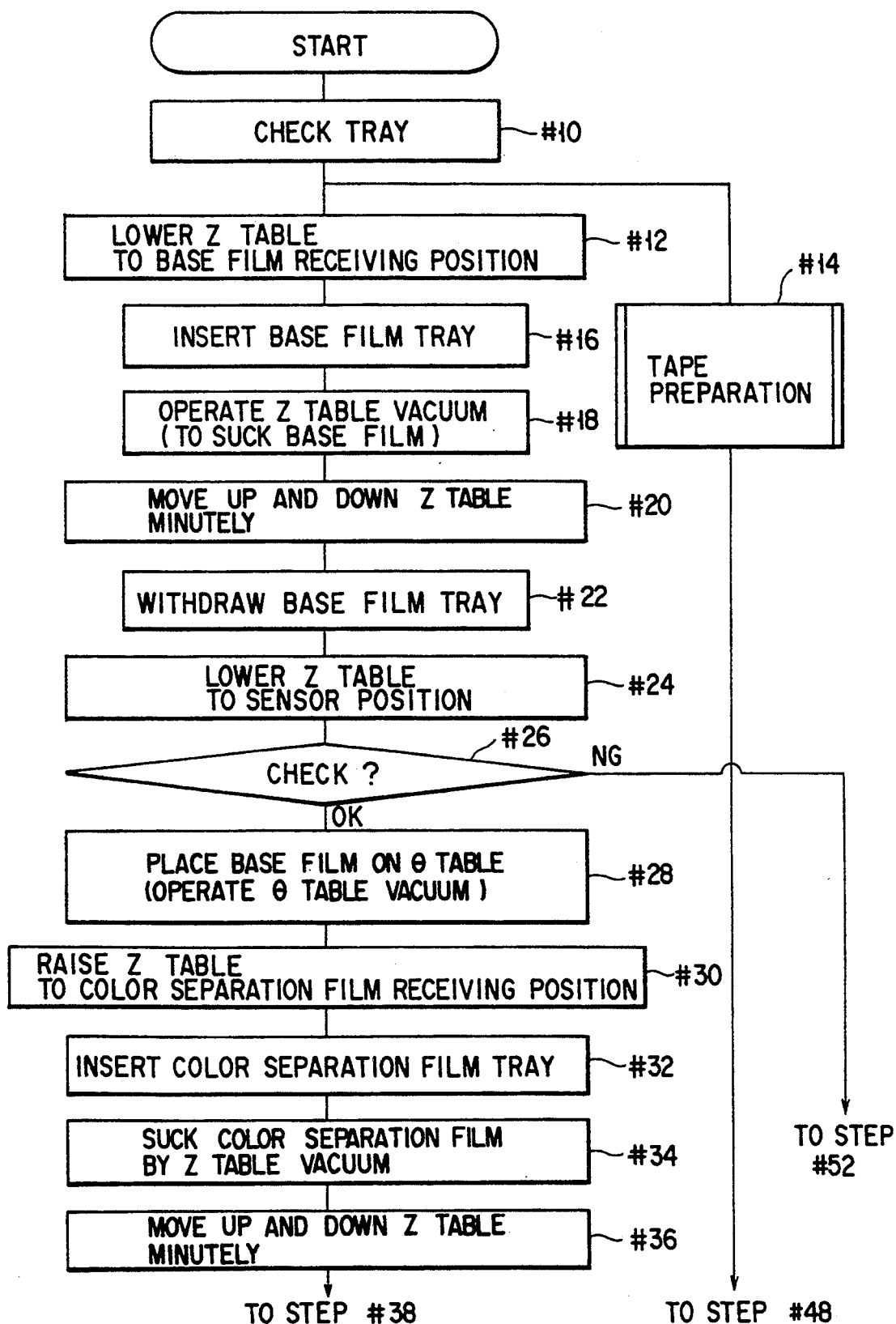
F I G. 24A

FILM PASTING APPARATUS

Background of the Invention

1. Field of the Invention

The present invention relates to a film pasting apparatus used for a photomechanical process.

2. Description of the Related Art

In a photomechanical process, color separation films (negative films or positive films) obtained by a color scanner in units of originals are pasted on base films in units of colors with a tape or an adhesive in accordance with a designated layout, and the base films are printed on reversal films (positive films or negative films) by a printer to perform a negative/positive reversing process. These reversal films are used to form press plates. In this case, positional registration between the respective color separation films of each original is performed as follows. While overlapping the color separation films of subsequent colors on the color separation film of the first color (normally, a magenta), an operator pastes the color separation films of other colors on the respective base films in accordance with the color separation film of the first color.

In the prior art, since registration is performed in a plate by plate manner by an operator with using the naked eye as described above, the operator feels fatigued, and the efficiency in work is low. In addition, since the registration precision varies depending on operators, it is difficult to form high-quality original plate films.

Summary of the Invention

The present invention has been made in consideration of the above situation, and has as its object to provide a film pasting apparatus which can perform a film pasting operation with high precision within a short period of time, and can easily form a high-quality original plate film.

According to the present invention, there is provided a film pasting apparatus for pasting a color separation film on a base film in a photomechanical process, comprising a lower table on which a base film is placed, the lower table having optical sensors; an upper table disposed above the lower table and having suction means and pasting means; a color separation film tray for storing a color separation film on which a first registration mark having two line segments defining a predetermined angle and a second registration mark having two line segments parallel to the two line segments of the first registration mark are formed at positions corresponding to the sensors; film picking means for changing a positional relationship between the color separation film tray and the upper table to locate the color separation film tray at a position below the upper table and to draw the color separation film to the upper table by the suction means; film registering means for changing a positional relationship between the color separation film tray and the upper table to withdraw the color separation film tray from the position below the upper table and to detect the registration marks of the color separation film drawn to the upper table by using the sensors, for aligning a positional relationship between the upper table and the lower table based on a result of detection of the registration marks, and for placing the color separation film on the base film placed on the lower table; and means for operating the pasting means to paste the color separation film on the base film.

According to the film pasting apparatus of the present invention, by setting the color separation films in the color separation film tray, registration of the respective films and film pasting operations are automatically performed. Therefore, the degree of fatigue felt by an operator can be reduced, and a high-precision film pasting operation can be performed within a short period of time, thereby efficiently forming high-quality original plate films. In addition, a positional misalignment is detected in accordance with the timings at which the sensors detect the line segments constituting the registration marks while at least one of the upper and lower tables is moved. Therefore, even if a color separation film is greatly shifted from the proper position, the positional misalignment can be detected to allow a registration operation.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 shows the arrangement of a lower table;

FIG. 5 is a view showing the arrangement of registration marks on a color separation film;

FIG. 14 is a view showing an inclined portion, an elastic member, and a roller formed on the rear portion of a tray;

FIGS. 15A and 15B are views for explaining an example of the process of picking a base film or a color separation film from a tray and causing it to be sucked to an upper table;

FIG. 23 is a block diagram showing the overall arrangement of the embodiment;

FIGS. 24A and 24B are flow charts showing an operation of the embodiment; and

DETIALED DESCRIPTION OF THE PREFERRED EMBODIMENTS

Figure 1:
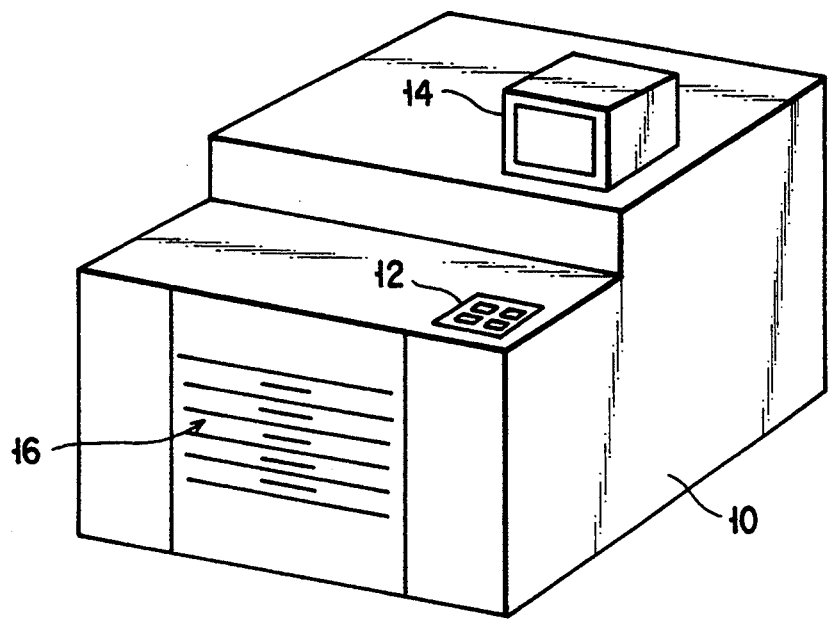
FIG. 1 is a schematic view showing the overall arrangement of a film pasting apparatus according to an embodiment of the present invention.
Figure 2:
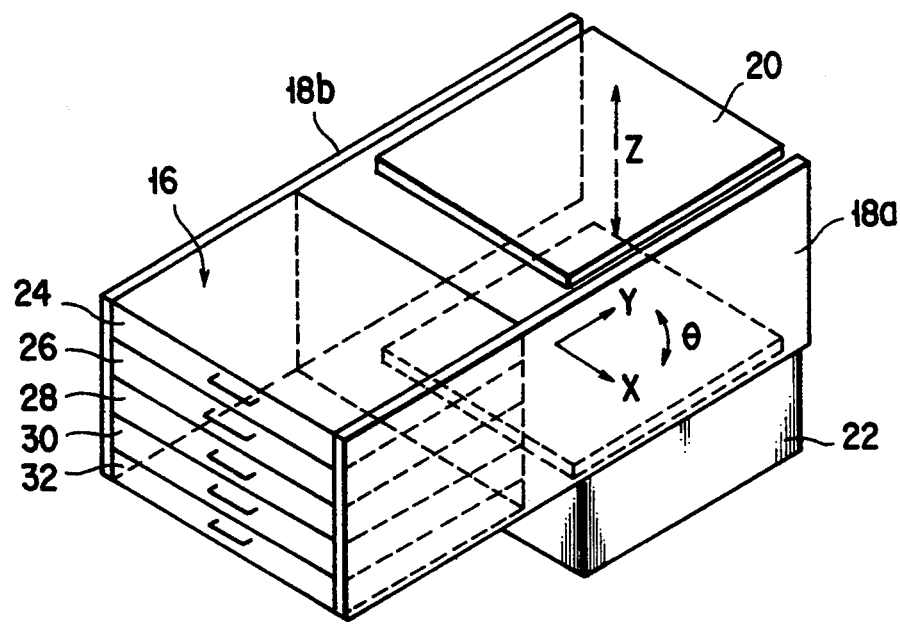
FIG. 2 is a perspective view showing the internal structure of the main body of the apparatus.
Figure 3A:
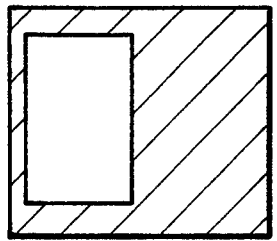
FIGS. 3A to 3I are views showing various layout sheet patterns.
Figure 3B:
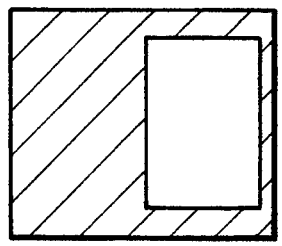
Figure 3C:
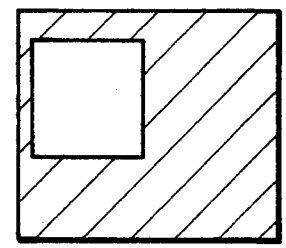
Figure 3D:
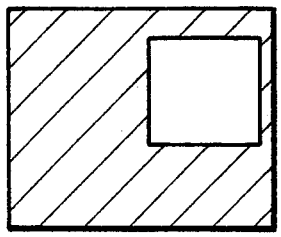
Figure 3E:
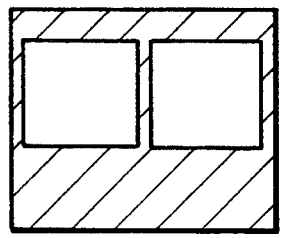
Figure 3F:
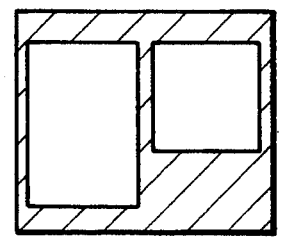
Figure 3G:
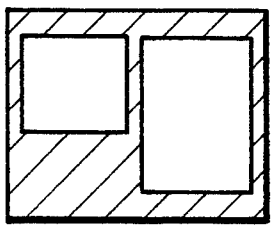
Figure 3H:
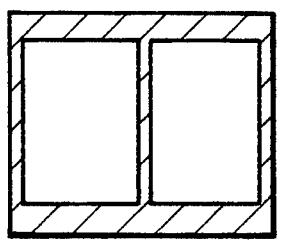
Figure 3I:
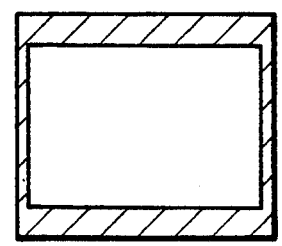

A preferred embodiment of a film pasting apparatus according to the present invention will now be described with reference to the accompanying drawings. FIG. 1 is a schematic view showing the outer appearance of the embodiment. FIG. 2 is a schematic view showing the internal structure of the embodiment.

A key switch device 12 and a CRT monitor 14 are arranged on a main body 10 of the apparatus. A tray unit 16 is formed on the front surface of the apparatus main body 10. The tray unit 16 serves to store base films, color separation films, and base films on which color separation films are already pasted. Although either positive films or negative films can be used as the color separation films, negative films are used in this example. The key switch device 12 serves to supply various commands to the apparatus. The CRT monitor 14 serves to inform an operator of the operation state of the apparatus or give various types of warnings to the operator. Note that the contents of the display by the CRT monitor 14 may be output by a printer (not shown). The base films on which the color separation films are pasted in units of colors are negative/positive reversed by the printer to be formed into original plate films in units of colors.

In the case of a newspaper, a base film has a size corresponding to a double-page spread, and a color separation film output from a scanner has a size corresponding to 12 or 15 columns on one page, or a double-page spread (15 columns). Although a photograph is not always printed in the entire width of a newspaper, an output color separation film always has a size corresponding to the entire width (of one page or a double-page spread). Therefore, a photograph is laid out to be placed at a desired position on a color separation film, and portions other than the portion on which the photograph is laid out are formed into light-shielding portions. A base film is also shielded in advance except for a portion on which a color separation film is pasted. In this embodiment, the nine types of base films shown in FIGS. 3A to 3I are prepared in accordance with pasting patterns so that base films are selected in accordance with the sizes and pasting positions (locations) of color separation films. Referring to FIGS. 3A to 3I, the hatched portions indicate light-shielding portions, and color separation films are pasted on blank portions (window portions). In newspaper printing, a photographic portion is printed by using four color separation films, i.e., Y (yellow), M (magenta), C (cyan), and K (black) films, while a character portion is printed by using an exclusive monochromatic film. For this reason, a total of five color separation films is required for one printed material.

In the apparatus main body 10, as shown in FIG. 2, the tray unit 16 is held by a pair of left and right holding frames 18a and 18b and is designed to be slidable forward and backward. With this structure, the tray unit 16 can be inserted into the apparatus main body 10 to allow base films and color separation films to be automatically picked from trays, or can be withdrawn from the main body 10 to allow base films and color separation films to be set in the trays. An upper table (capable of moving in the vertical direction (Z direction) and hence to be referred to as a Z table hereinafter) 20 and a lower table 22 are disposed in the main body 10 at the rear portions of the holding frames 18a and 18b so as to be parallel to each other. The tray unit 16 can be inserted between the upper and lower tables 20 and 22 by means of a rodless air cylinder.

The tray unit 16 is constituted by a total of five trays, i.e., two pairs of base film trays and color separation film trays respectively storing base films and color separation films which have not undergone a film pasting process yet, and one discharge tray in which base films which have undergone a film pasting process are collected. In this case, a first color separation film tray 24, a first base film tray 26, a second color separation film tray 28, a second base film tray 30, and a discharge tray 32 are arranged from above in the order mentioned. Since two pairs of trays respectively storing base films and color separation films are arranged in this manner, while one pair of trays is operated (during a period in which a base film and color separation films are picked from the trays), color separation films and a base film can be set in the other pair of trays, thus improving the operation efficiency.

When one of the trays is inserted into the apparatus main body and is moved to a position immediately below the Z table 20, the Z table 20 is lowered to pick a base film or a color separation film from the tray by suction using a vacuum unit (not shown). When the tray is withdrawn from the main body to return to the original position (the position shown in FIG. 2), the Z table 20 is further lowered, thereby placing the base film on the lower table 22. The lower table 22 also includes a vacuum unit to hold the base film by suction. The lower table 22 can be moved in the transverse direction (x direction) and longitudinal direction (y direction) within a horizontal plane and can be rotated in a direction $\theta$ to perform registration of the color separation film. Hereinafter, the lower table 22 will be referred to as a $\theta$ table.

Although not shown, an identification mark for identifying one of the pasting patterns shown in FIG. 3 is attached to the base film. The $\theta$ table 22 includes an optical sensor for detecting this mark when a base film is sucked to the Z table 20. In addition, identification marks indicating a color and an odd/even page are attached to each color separation film. The optical sensor of the $\theta$ table 22 also detects these identification marks. The size, position, and the like of each color separation film are identified when the optical sensor detects the size and position themselves. In accordance with the result of this identification, the pasting pattern of the base film shown in FIG. 3 is matched with the color separation film in terms of size, set location and direction, and the like. If they do not coincide with each other, a corresponding warning is produced. With this operation, erroneous setting of base films and color separation films in the tray unit 16 can be detected to prevent erroneous pasting operations.

FIG. 4 shows the $\theta$ table 22 in detail. The $\theta$ table 132 includes a Y table 134 disposed on a base portion 132 through movable supports to be movable in the y direction (longitudinal direction), and an X$\theta$ table 136 disposed on the Y table 134 through movable supports 138 to be movable in the x direction (transverse direction) and be rotatable within a plane. The Y table 134 is moved in the y direction by an y-axis driving motor 140 through a known feed screw mechanism disposed in the y direction. The driving motor 140 is arranged on the base portion 132.

On the Y table 134, an X1-axis driving motor 142a, an X2-axis driving motor 142b, an X1-axis guide 144a, and an X2-axis guide 144b are arranged. The X1- and X2-axis guides 144a and 144b extend along the x direction to be parallel to each other. The rotating shaft of the X1-axis driving motor 142a is connected to an X1-axis feed screw 146a. The rotating shaft of the X2-axis driving motor 142b is connected to an X2-axis feed screw 146b. An X1-axis carriage 148a designed to slide on the X1-axis guide 144a is meshed with the X1-axis feed screw 146a. An X2-axis carriage 148b designed to slide on the X2-axis guide 144b is meshed with the X2-axis feed screw 146b. The X1-axis carriage 148a holds the X$\theta$ table 136 through a rotating pivot support 150, whereas the X2-axis carriage 148b holds the X$\theta$ table 136 through a slide pivot support 152. The rotating pivot support 150 holds the X$\theta$ table 136 to allow the table 136 to be freely rotated about a pin portion extending from the table 136. The slide pivot support 152 holds a pin portion extending from the X$\theta$ table 136 to allow the pin to freely slide in the y direction.

With this structure, the X$\theta$ table 136 can be rotated about the rotating pivot support 150 by driving the X2-axis driving motor 142b while stopping the X1-axis driving motor 142a. In addition, the X$\theta$ table 136 can be moved along the X1- and X2-axis guides 144a and 144b in the x direction by driving the X1- and X2-axis driving motors 142a and 142b at the same speed.

Pins 154 for registration a base film are formed on the upper surface of the X$\theta$ table 136 at the upper right and left corners. In addition, a large number of suction holes (not shown) are formed in the upper surface of the X$\theta$ table 136 to draw a base film or a negative film by suction. Each pin 154 has an acute-angle distal end to be easily inserted into a corresponding registration hole in a base film. The suction holes are connected to a table vacuum unit (not shown). Note that the pins 154 are retractable and are lowered to retract into the table 136 when a base film which has undergone film pasting processing is to be discharged. In this case, the table vacuum unit is also stopped.

In this embodiment, a base film is placed on the X$\theta$ table 136 upon registration by means of the pins 154. However, since no registration holes can be formed in a color separation film, four of registration marks 170a to 170h are formed on the four corners of the film 166 when the film 166 is output from a color scanner, as shown in FIG. 5. With this arrangement, a positional misalignment is detected by detecting two registration marks, of these four marks, which are located at the largest distance in one of the row and column directions. For example, if a film has only one page, a positional misalignment is detected by using the pair of marks 170b and 170e, the pair of marks 170b and 170g, the pair of marks 170c and 170f, or the pair of marks 170c and 170h are used. If a film has two pages, i.e., a double-page spread, the pair of marks 170a and 170d are used. Each mark has a substantially L-shape constituted by two line segments having the same length with their end points connected to each other at 90°.

Figure 6:
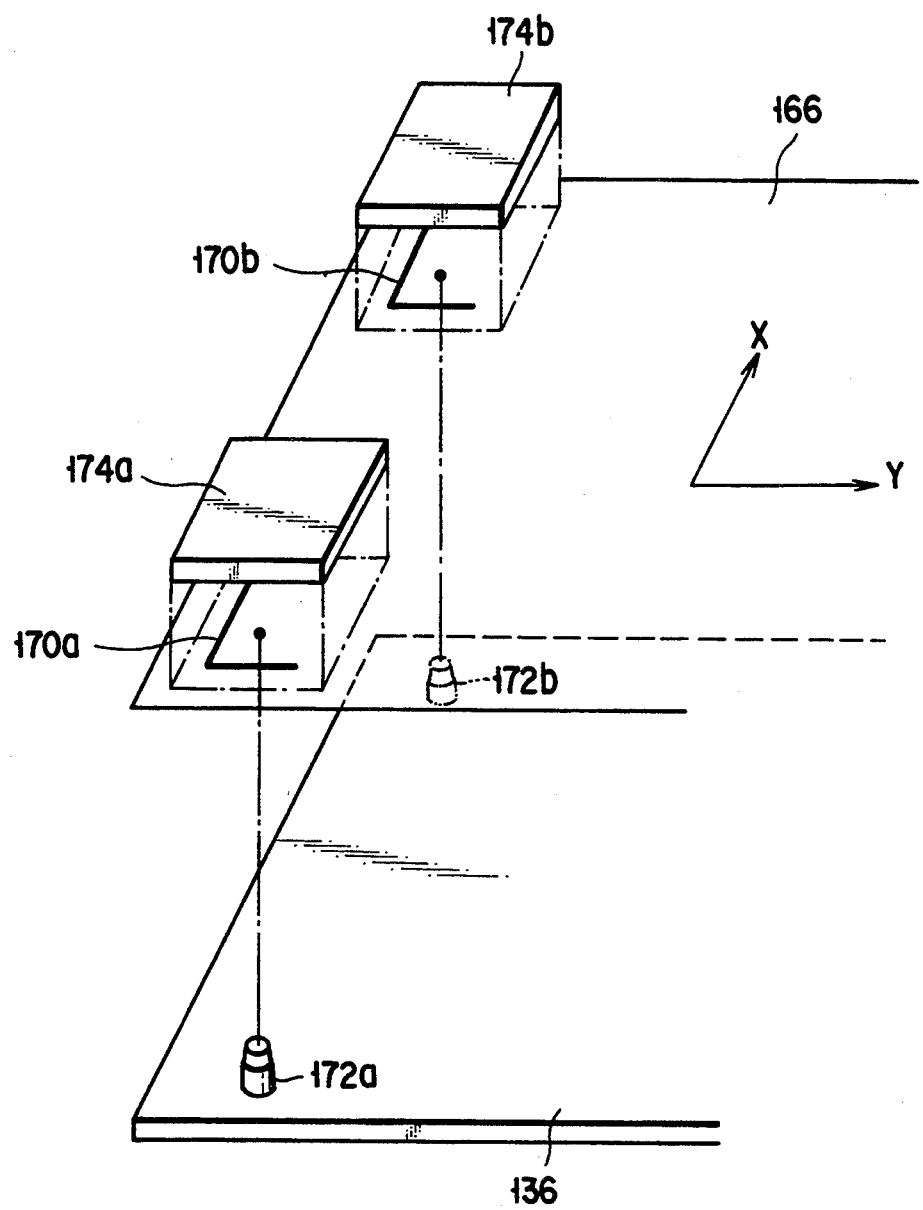
FIG. 6 is a view showing a mechanism for detecting registration marks.

FIG. 6 shows an arrangement for detecting a positional misalignment by using the marks 170a and 170b. Optical sensors (spot sensors) and 172a, 172b, and the like are disposed in the X$\theta$ table 136 at positions corresponding to these marks. Light sources 174a, 174b, and the like are arranged in the upper table (not shown in FIG. 6) at positions corresponding to the sensors 172a, 172b, and the like to uniformly illuminate predetermined regions (square regions in this case) including the registration marks 170a, 170b, and the like. Assume that the color separation film 166 is a negative film. In this case, the film 166 shields light, but right passes through the marks on the film. Therefore, when the X$\theta$ table 136 is moved to cause the mark 170 to cross the detection spot of the sensor 172, the transmitting light is incident on the sensor 172, and the mark is detected. Since the detection spot of each sensor 172 is a very small point, the detection precision is high. In this case, transmission type sensors are used to realize uniform detection precision. The precision of a reflection type sensor may vary depending on a reflecting direction. Although not shown, a circular aperture or a pin hole is formed immediately before each sensor to detect only light incident at a right angle, thereby increasing the detection precision. Alternatively, a magnifying objective lens having a magnification of about $\times 10$ may be disposed at the front surface of each sensor to increase the detection precision. Such a means for increasing the detection precision is employed for the following reason. If the precision of each sensor itself is increased, dust and the like smaller than each mark, which adhere to a film surface, are detected, requiring cumbersome post-processing. In contrast to this, if a magnifying lens is used, dust or the like having a diameter smaller than an effective depth of focus is blurred so as not to be detected. In general, in order to increase the precision of a transmission type sensor, light to be transmitted must be modulated in an on/off manner, and the axis of emitted light and that of received light must be caused to coincide with each other, resulting in difficulty in design. However, in this embodiment, since the precision is sufficiently high, as described above, light to be radiated need not be modulated. For this reason, since each light source can be completely separated from a corresponding light-receiving portion (sensor) as long as uniform radiation is realized, the degree of freedom in design is high.

Although not shown in FIG. 5, in this embodiment, a color mark (color circle) corresponding to the color component of a color separation film, and a mark indicating an odd or even page is formed, as identification marks other than registration marks, on a film. Assume that a film having no color mark is a monochromatic film. No odd and even page marks are basically formed on a monochromatic film.

In accordance with the detection results obtained by such spot sensors with respect to registration marks, the X$\theta$ table 136 is rotated, while the X$\theta$ table 136 and the Y table 134 are respectively moved in the x and y directions such that the positions of the respective marks coincide with each other throughout four films, thereby performing a registration operation.

A registration operation using the marks 170a and 170b shown in FIG. 6 will be described below with reference to FIG. 7. The relative positions of the two marks 170a and 170b on a film are set such that one side of one mark and one side of the other mark are located on the same straight line or made parallel to each other at a predetermined distance. Note that since the two line segments of each mark are connected to each other at 90°, the other side of one mark is parallel to the other side of the other mark. There is a possibility that marks are formed on a film in such a manner that one side of one mark and one side of the other mark are not located on the same straight line or are not parallel to each other. In general, however, since each line segment constituting a mark is about 1 cm, and a distance L between two marks is very long relative to each line segment, an error angle $\Delta\theta$ shown in FIG. 8 can be neglected.

Figure 9:
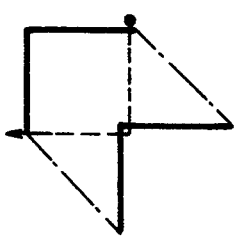
FIG. 9 is a view showing a positional misalignment detection range.

Note that the initial position of each sensor with respect to a corresponding mark must be set such that the two line segments constituting the mark always cross the detection spot of the sensor, as shown in FIG. 9, when the $\theta$ table 22 (sensor) is moved in the X and y directions by predetermined distances. That is, the positional misalignment detection range is in the range defined by the alternate long and short dashed lines between the two marks shown in FIG. 9. According to this embodiment, in order to widen the detection range, it is only required that the size of each mark be increased, and the predetermined distance the $\theta$ table 22 moves be increased. With this increase in detection range, the detection precision is not degraded. This predetermined distance is normally set to be equal to the length of a line segment of each mark.

Figure 7:
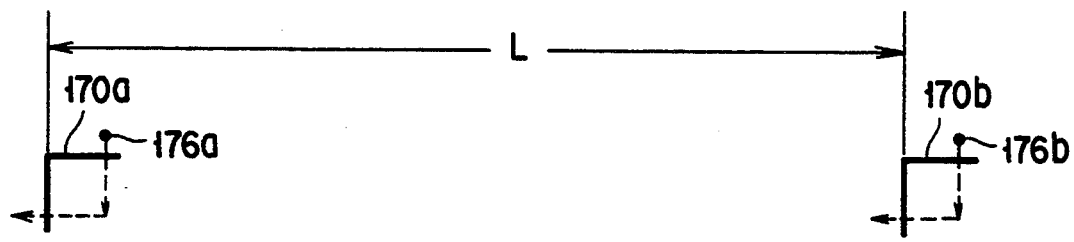
FIG. 7 is a view showing a positional misalignment detecting operation.
Figure 8:
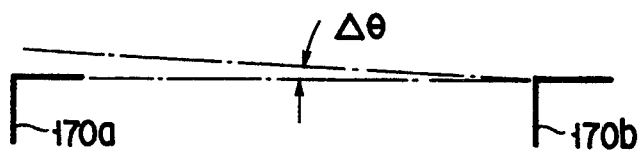
FIG. 8 is a view for explaining an angle error between the two registration marks.

As shown in FIG. 7, the $\theta$ table 22 (Y table 134) is moved in the y direction (longitudinal direction in FIG. 7) by a predetermined distance. Meanwhile, the marks 170a and 170b cross detection spots 176a and 176b of the sensors 172a and 172b. During this period, sensor light is incident on the sensors 172a and 172b. As a result, the timings at which the central positions of the respective mark line segments are located on the detection spots 176a and 176b can be detected on the basis of the outputs from the sensors 172a and 172b. Since the positions of the sensors 172a and 172b are known, the positional misalignment or inclination of the film in the y direction can be detected. In accordance with this detection result, the X$\theta$ table 136 is rotated, and the Y table 134 is moved in the y direction, thereby performing a registration operation.

Subsequently, the $\theta$ table 22 (X$\theta$ table 136) is moved in the x direction by a predetermined distance. Similarly, if the marks 170a and 170b respectively cross the detection spots 176a and 176b of the sensors 172a and 172b while the table 136 is moved, the timings at which the central positions of the respective mark line segments are located on the detection spots 176a and 176b can be detected on the basis of the outputs from the sensors 172a and 172b, thus detecting the positional misalignment of the film in the x direction. In accordance with the result of this detection, the X$\theta$ table 136 is moved in the x direction to perform a registration operation.

Figure 10:
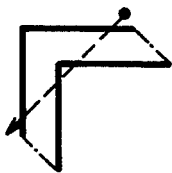
FIG. 10 is a view showing a modification of the positional shift detecting operation.

With this operation, even if the film is greatly shifted from the proper position, the positional misalignment can always be detected, and registration can be performed by rotating and moving the $\theta$ table 22 in accordance with the detection result. Note that a film need not be moved in two orthogonal directions, i.e., the x and y directions, to detect marks by the spot sensors, but may be moved in an oblique direction such that two line segments cross a detection spot upon one movement of the film, as shown in FIG. 10.

Figure 11:
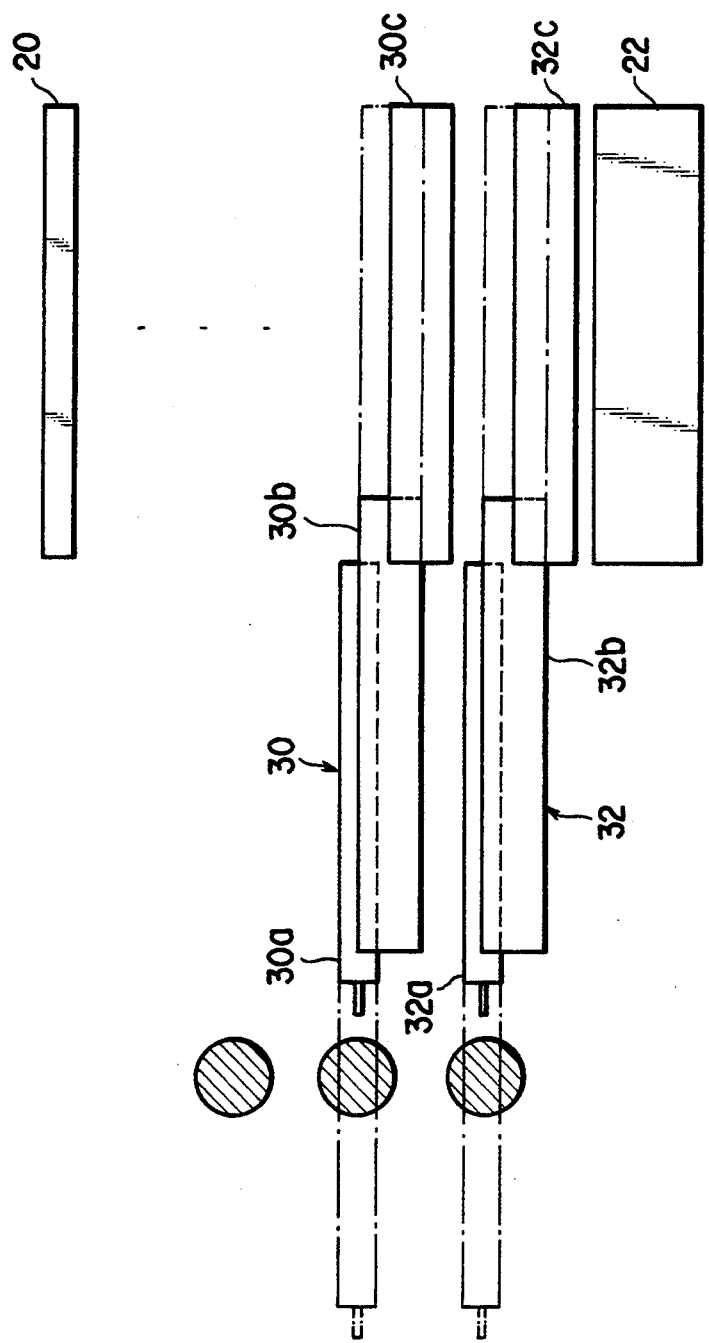
FIG. 11 is a view showing a support mechanism for trays having a double structure to be manually pulled outside the main body and automatically inserted into the main body.

Referring to 2, the trays are supported by the two support frames 18a and 18b for the sake of descriptive convenience. In practice, however, support frames are disposed for each tray, as shown in FIG. 11. In addition, each support frame for each tray has a double structure. This structure will be described below with reference to the tray 30. A tray member 30a is mounted on a first support frame 30b to be slidable forward/backward, and the first support frame 30b is mounted on a second support frame 30c to be slidable forward/backward. The second support frame 30c is provided in the apparatus main body 10 between the Z table 20 and the $\theta$ table 22. As shown in FIG. 11, the first support frame 30b is normally protruding from the second support frame 30c toward the front side of the apparatus, and the tray member 30a is located on the first support frame 30b. This state corresponds to the state shown in FIG. 2. The tray member 30a and the first support frame 30b are moved forward/backward by a rodless air cylinder (not shown). Note that when the air cylinder is turned off, the tray member 30a can be manually moved forward/backward. Therefore, when base films and color separation films are to be set in the trays 24, 26, 28, and 30 or base films which have undergone a film pasting process are to be recovered from the discharge tray 32, the air cylinder is turned off. If, for example, a tray member 30a is withdrawn from the first support frame 30b to the position indicated by the alternate long and short dashed line in FIG. 11, films can be easily set or the base films can be easily recovered. Thereafter, when the tray member 30a is pushed into the original position (indicated by the solid lines in FIG. 11), and the apparatus is started again, the first support frame 30b is moved backward (to the right in FIG. 11) along the second support frame 30c and is inserted into the apparatus main body together with the tray member 30a, while the tray member 30a is fixed to the first support frame 30b. Subsequently, a base film or a color separation film is picked from the tray member 30a by the lowered Z table 20. A base film, which has undergone a film pasting process, located on the $\theta$ table 22 is drawn to the Z table 20 by suction. After the Z table 20 is raised, the base film is stored in the discharge tray which is moved to a position below the Z table 20. The air cylinder is turned off and the apparatus is started by operating the key switch device 12 shown in FIG. 1.

As described above, during an operation of the apparatus, the tray unit 16 is automatically inserted into the main body and is returned to the original position. Therefore, if an operator carelessly holds the handle of the tray, the hand may be pulled into the apparatus main body, or if the operator inserts his/her hand into the apparatus main body while the tray is inserted in the apparatus main body, the hand is caught in the tray when it returns. In order to prevent such an accident, it is preferable that an operator refrain from reaching the apparatus. For this purpose, in this embodiment, beam sensors for horizontally radiating beams in front of the apparatus are arranged in correspondence with the respective trays. The hatched circular regions shown in FIG. 11 indicate the detection ranges of the respective sensors. With this arrangement, when part of the body of an operator, e.g., a hand, approaches the handle of one of the trays at the front surface of the main body, the corresponding beam is interrupted, and this state is detected. The detection result is informed as a warning by a buzzer or the like. This warning prevents the operator from carelessly reaching the tray and having an accident.

However, as described above, the base film trays and the color separation film trays are arranged in pairs so that while one pair is operated, base films and color separation films can be set in the other pair to prepare for the next operation. If, therefore, the beam sensors are always operated, an warning is generated during a preparation for the next operation, annoying the operator. For this reason, only the beam sensor arranged in front of the tray which is being operated is selectively operated. With this arrangement, only an approach to the tray which is being operated can be selectively detected, and an effective warning can be generated.

Although not shown, doors which can be freely opened and closed are disposed on the side and rear surfaces of the apparatus main body to allow inspection of the interior of the apparatus when an operation error, e.g., jamming of a color separation film or a base film, is caused. These doors include door switches for detecting opening/closing of door. Each door switch detects an open state of the door to generate a warning or stop the operation of the apparatus, thus providing a safety measure.

The internal structure of each tray will be described next. Although not shown, registration pin holes are formed in each base film, and pins corresponding to the pin holes are formed on the bottom surface of the base film trays 26 and 30. When a base film is to be set in one of the trays 26 and 30, the film is positioned with respect to the pins. When the base film is to be picked, the pins are lowered and retracted into the tray to facilitate the picking operation. Five color separation films (Y, M, C, K, and monochromatic films) can be stored in each of the trays. Therefore, a maximum of ten base films which have undergone a film pasting process can be stored in the discharge tray 32. Note that if a base film having a color separation film pasted on one half (one page) of a double-page spread portion thereof is set in one of the base film trays, so-called re-pasting can be performed, i.e., pasting of a color separation film on the other half (the other page) of the base film.

Figure 12:
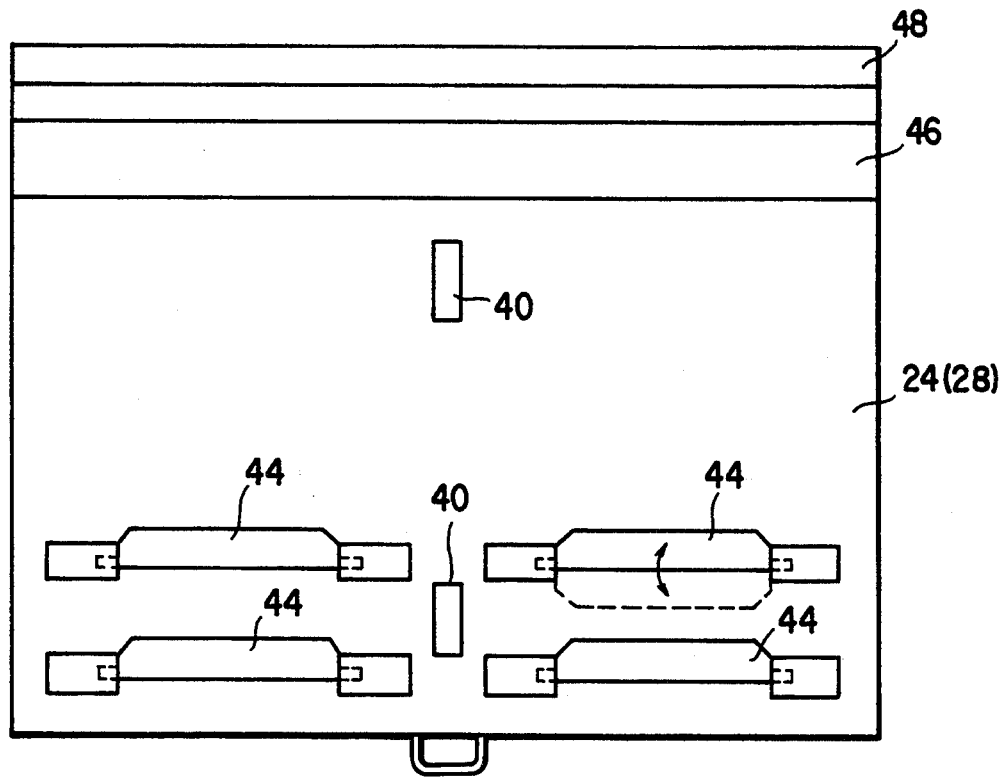
FIG. 12 is a view showing the positions of film pressing plates which are disposed on the bottom surface of a color separation film tray in accordance with the sizes of color separation films.
Figure 13:
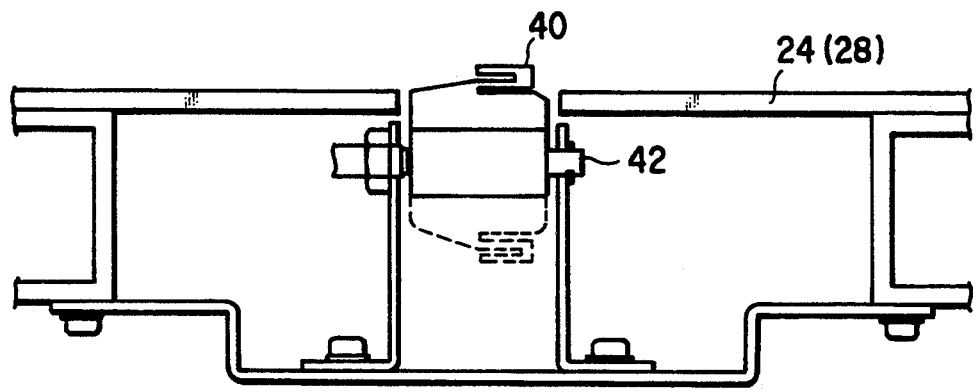
FIG. 13 is a sectional view showing a film separator disposed on the bottom surface of the color separation film tray and designed to separate color separation films corresponding to left and right pages.

FIG. 12 is a plan view showing the color separation film trays 24 and 28. As described above, each base film has a size corresponding to the double-page spread of a newspaper, and color separation films have two sizes corresponding to 12 columns and 15 columns when they are prepared in units of pages. If the photograph to be printed in the left and right pages of a newspaper has the same number of columns, a double-page spread color separation film is formed. If they have different number of columns, color separation films must be respectively formed for the left and right pages and set on the left and right in the tray. In this case, since a color separation film is slightly larger than a base film, if color separation films are arranged on the left and right, they overlap at a central portion in the tray. This makes it difficult to set color separation films in the tray and to pick the color separation films from the tray. In order to properly set a color separation film of each page in a corresponding region, a plurality (two in this case) of separators 40 are disposed in the middle of each tray. As shown in the sectional view of FIG. 13, the separator 40 includes a projection having a substantially S-shaped cross-section to allow the color separation films of left and right pages to be vertically separated and stacked. The separator 40 can be rotated about a shaft 42. When a color separation plate for a double-page spread is to be set, the separator 40 is reversed to retract the projection into the tray, as indicated by the broken line, and the bottom surface of the tray is made flat, thereby preventing the separator 40 from hindering a setting operation of the color separation film corresponding to two pages.

Furthermore, in order to set color separation films having different numbers of columns at proper positions, film pressing plates 44 are disposed at positions corresponding to the front end portions of 12- and 15-column color separation films. The film pressing plates 44 are axially supported along the horizontal direction. Before a color separation film is set, the film pressing plates 44 are raised. After the color separation film is set with the rear end thereof positioning at the rear end of the tray, the film pressing plates 44 are lowered to hold the front end of the color separation film.

The bottom surface of a rear end portion 46 of each color separation film tray is slightly raised to form an inclined portion. In addition, an elastic member 48 is formed on the wall of the rear end of the tray. When a plurality of color separation films are drawn to the Z table 20 by suction, the elastic member 48 serves to strip the second and subsequent films from the Z table 20. Note that such inclined portions 46 and elastic members 48 are formed not only in the color separation film trays but also in the base film trays. They are formed to reliably pick color separation films and base films one by one.

The rear end portion of each tray will be described in detail below. FIG. 14 shows the rear end portion of each of the base film trays and color separation film trays in detail. A spacer 60 is formed on the bottom surface of the rear portion, and a slope plate 62 is formed on the spacer 60, thus forming the inclined portion 46 which is inclined upward. In addition, an elastic member 64 (48) consisting of a sponge rubber material or the like extends horizontally from the upper end of the rear wall. When a plurality of base films or color separation films are almost drawn to the Z table 20 by suction, the elastic member 64 serves to strip the second and subsequent films from the Z table 20. For this purpose, the elastic force of the elastic member 64 is set to strip films with a force smaller than the suction force of the Z table 20 (to be described later). In addition, a roller 66 is mounted outside the rear wall of the tray.

When the film is to be drawn to the Z table 20 by suction, the roller 66 causes the films to be reliably drawn to the Z table 20 when the tray is withdrawn from the main body.

The process of picking a base film or a color separation film from one of the trays and drawing it to the Z table 20 by suction will be described below with reference to FIG. 15A and 15B.

Figure 16:
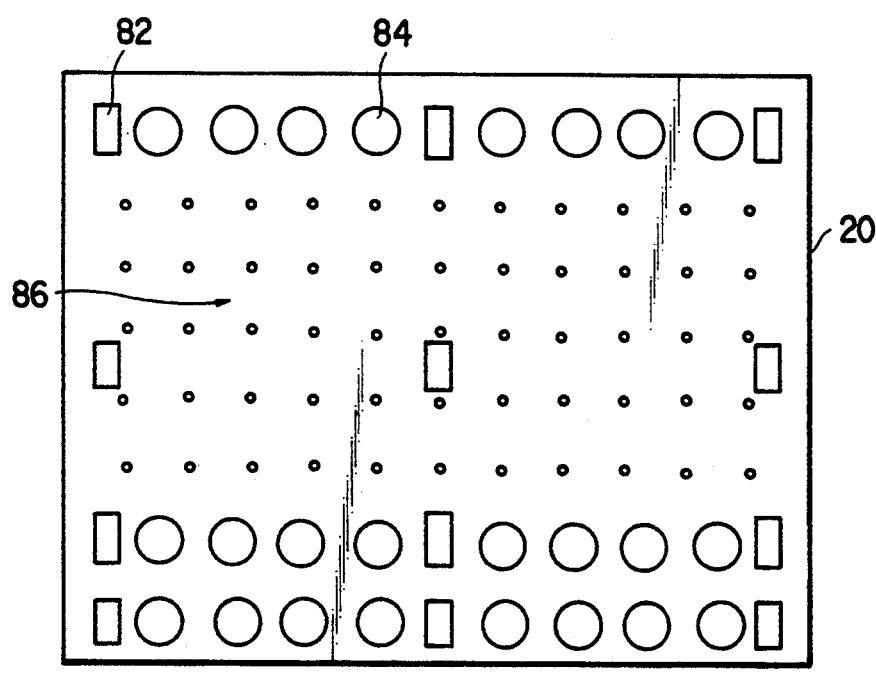
FIG. 16 is a view showing the arrangement of suction pads and suction holes formed in the upper table.

As shown in FIG. 15A, when the tray is completely inserted into the apparatus main body (to the position immediately below the Z table 20), the Z table 20 is lowered. As shown in FIG. 16, a number of suction pads 84 are formed in peripheral portions of the Z table 20, and a large number of smaller suction holes 86 are formed in the entire surface of the Z table 20. With this structure, a base film or a color separation film is drawn to the Z table 20 in such a manner that the film is drawn by the suction pads 84 at the rear end of the film and drawn by the suction holes 86 throughout the film. When the Z table 20 is lowered, a vacuum unit of the Z table 20 (not shown) is operated. Since the rear end portion of the tray is inclined upward, the rear end portion of the base film or the color separation film is drawn first to the Z table 20 by suction. Even if a plurality of base films or color separation films are attracted to the Z table by static electricity or the like, the second and subsequent films are stripped from the Z table 20 owing the above-described function of the elastic member 64. As a result, only the uppermost base film or color separation film is drawn to the Z table 20 by suction. In order to reliably perform such a stripping operation, the Z table 20 may be finely moved up and down. With this operation, the second and subsequent base films and color separation films are swung and dropped from the Z table 20.

Subsequently, as shown in FIG. 15B, when the tray is withdrawn from the apparatus main body, portions other than the rear portion, of the base film or the color separation film, drawn to the Z table 20 by suction, are pressed against the Z table 20 by the roller 66 upon withdrawal of the tray. As a result, the base film or the color separation film is completely drawn to the Z table 20 by suction.

Note that when color separation films of left and right pages are set on the left and right in the tray by using the separators shown in FIG. 12, the color separation films are picked one by one. In this case, only the suction pads 84 on the side from which the color separation film is picked are operated to draw air, while the suction pads 84 on the other side from which the color separation film is not picked are operated to blow air so as to urge the color separation film, which is not be to be picked, against the tray.

Figure 17A:
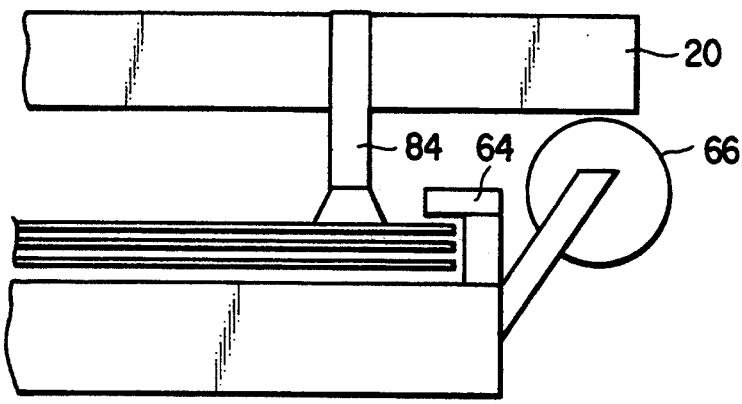
FIGS. 17A, 17B, and 17C are views for explaining another example of the process of picking the film from the tray and causing it to be sucked to an upper table.
Figure 17B:
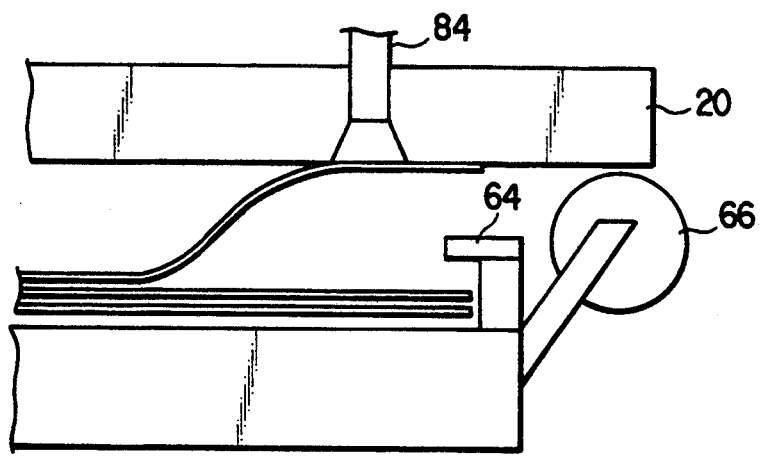
Figure 17C:
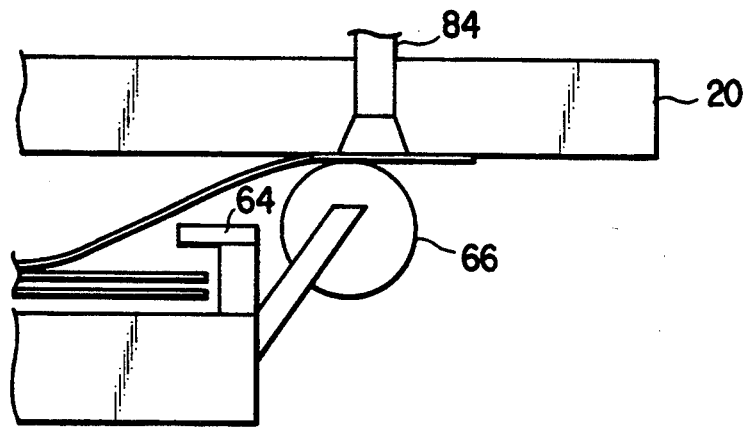

Though the Z table 20 is lowered in the above description, it is possible to lower the suction pads 84 as shown in FIGS. 17A, 17B, and 17C. When the tray is completely inserted between the Z table 20 and $\theta$ table 22, as shown in FIG. 17A, the Z table 20 is lowered, and the suction pad 84 is also lowered from the Z table 20 to be brought into contact with a base film or a color separation film in the tray. In this example, it is not necessary to provide the inclined portion. The pad vacuum unit is then operated, and the rear end of the base film or the color separation film is drawn to the suction pad 84 by suction. Thereafter, as shown in FIG. 17B, the suction pad 84 is raised, and the table vacuum unit is operated so that the rear end of the base film or the color separation film is drawn to the Z table 20 by suction. When the tray is withdrawn from the apparatus main body, the base film or the color separation film in the tray is urged against the Z table 20 by the roller 66 and is drawn to the Z table 20 by suction owing to the function of the table vacuum unit, as shown FIG. 17C.

Figure 18A:
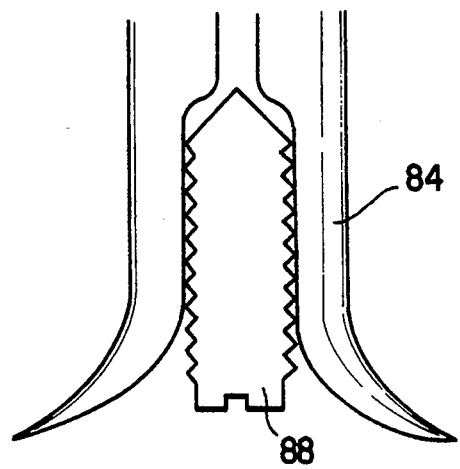
FIGS. 18A, 18B, and 18C are views for explaining a function of adjusting the suction force of the suction pad.
Figure 18B:
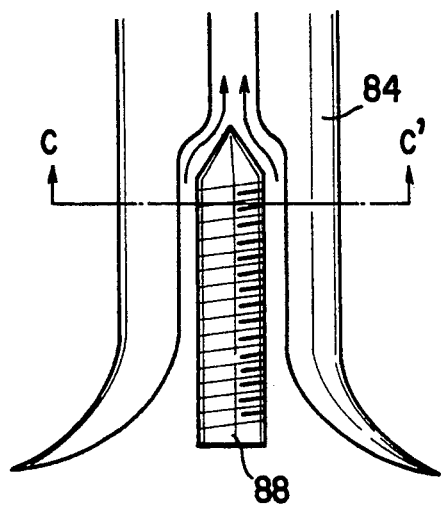
Figure 18C:
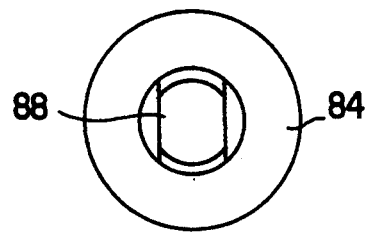

FIG. 18a, 18B, and 18C show the shape of each suction pad 84. FIG. 18A is a sectional view of the suction pad. FIG. 18B is a sectional view showing a cross-section crossing the cross-section in FIG. 18A at 90°. FIG. 18C is a sectional view taken along a line c-c' in FIG. 18B. The suction pad 84 is constituted by an elastic member such as a rubber member. A screw member 88 having a flatted cylindrical shape is inserted, as a plug, into the suction pad to ensure an air path. When the screw member 88 is rotated, the insertion depth of the plug is changed, and the sectional area of the air path indicated by the arrows in FIG. 18B is changed, thereby easily adjusting the strength of suction. Since the pad 84 is constituted by an elastic member, it is not necessary to form the plug by a screw member. A mere plug may be inserted in the pad 84 and the insertion depth of the plug may be manually adjusted.

In general, as the suction force of the suction pad 84 is increased to reliably pick a color separation film from a tray, the color separation film is deformed in the form of a projection in the hole of the pad. As a result, the flatness of the film may be impaired. If the flatness is impaired, registering marks (such as marks 170a to 170h shown in FIG. 5 or mark having a shape of cross) are distorted, resulting in hindering accurate registration between the respective colors. According to this embodiment, since the suction force of each suction pad can be easily and finely adjusted, a base film or a color separation film can be reliably picked from a tray without impairing its flatness.

Since film pasting units (to be described later) are disposed on the Z table 20, plural openings 82 (in this example, 3 columns×4 rows) through which film pasting is performed are formed in the Z table 20. Film pasting heads (to be described later) are vertically moved through these openings 82 to paste a color separation film on a base film on the $\theta$ table 22 with a tape.

The film pasting units disposed on the Z table 20 will be described in detail below. As indicated by the openings 82 in FIG. 16, three film pasting units are disposed in the transverse direction of the Z table 20. Each unit is capable of performing a film pasting operation at four positions. In practice, three of the four positions are selected in accordance with the size of a color separation film.

Figure 19:
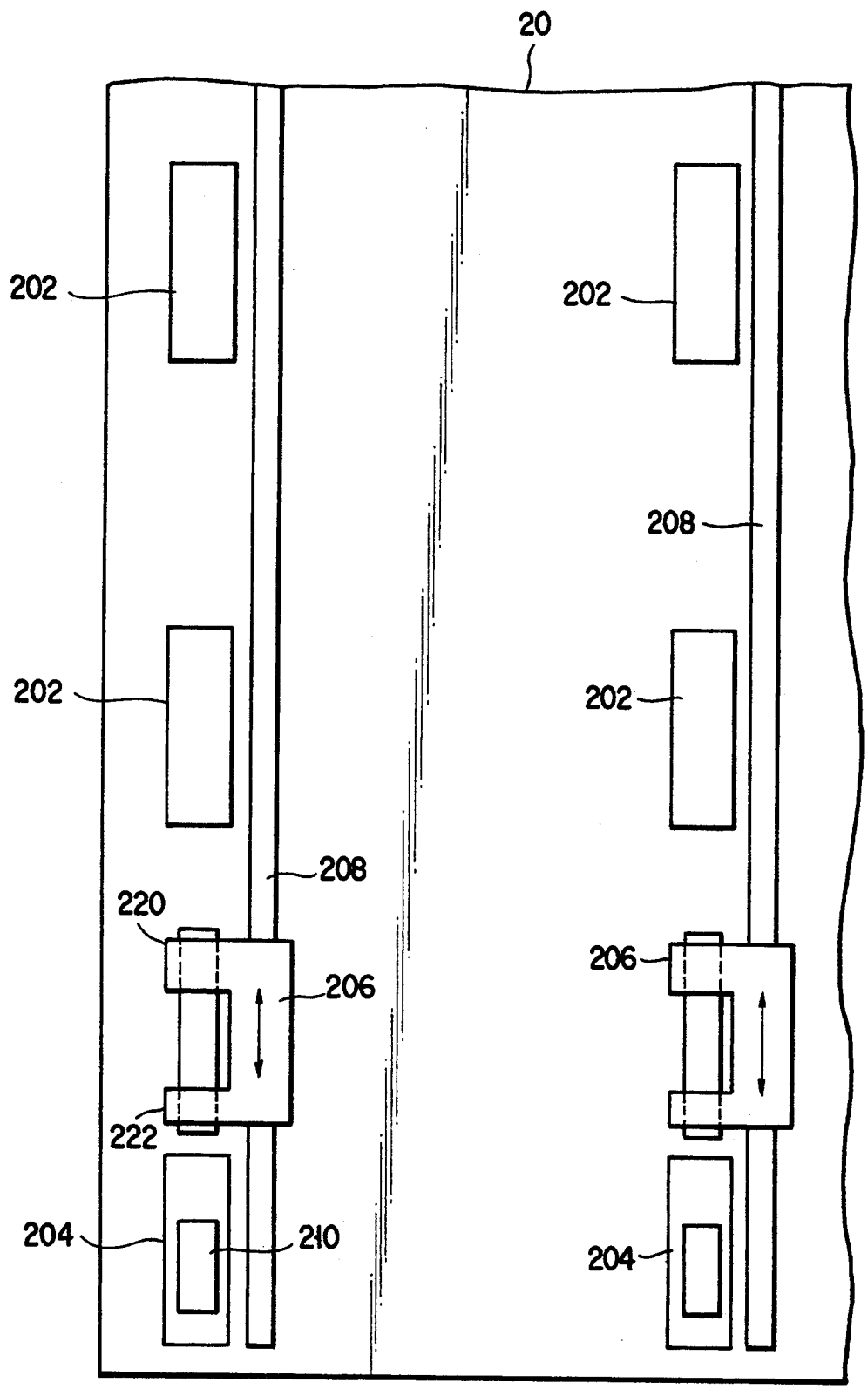
FIG. 19 is a view showing the arrangement of film pasting units on the upper table.

As shown in FIG. 19, each film pasting unit comprises a tape cassette 204 designed to hold a roll of continuous tape 210 and detachably disposed in the Z table 20, a tape pasting head 202 disposed above the opening 82 in correspondence therewith, two clamps 220 and 222 which are vertically opened/closed and spaced apart from each other by a predetermined distance, a shuttle 206 for cutting a piece of tape while the distal end portion of the continuous tape 210 is clamped by the clamps 220 and 222, and for transferring the piece of tape to the head 202, and a rail 208 allowing the shuttle 206 to travel. The shuttle 206 is reciprocated between the tape cassette 204 and the tape pasting head 202 along the rail 208 by an air cylinder (not shown). A cutter for cutting a piece of tape from the continuous tape 210 is disposed on the tape cassette 204.

An operation of the film pasting unit will be described below with reference to FIGS. 20A, 20B, and 20C. The tape cassette 204 has the continuous tape 210 formed of a pasting tape wound around an annular core a large number of times. The tape pulled out from the continuous tape 210 is held by a roller pair 214 through a roller 212. In this case, the adhesive surface of the tape faces downward. Although not shown, a sensor for detecting the residual amount of the continuous tape 210 is disposed on the Z table 20, and a dog for a sensor is formed on the tape cassette 204. With this structure, the tape cassette 204 can be easily detached from the Z table 20 to replace the tape 210 and a cutter 216. Therefore, such replacement can be easily performed. Note that when the continuous tape 210 is to be set, the distal end of the tape must slightly protrude from the roller pair 214. When the clamps 220 and 222 are closed, they clamp the tape. When the clamps 220 and 222 are open, they can move astride the roller pair 214. The cutter 216 for cutting the tape 210 is disposed in front of the roller pair 214. The clumps 220 and 222 are provided on the shuttle 206 and the distance between the clamps 220 and 222 is set to be slightly longer than the length of the tape pasting head 202. The roller pair 214 and the clamps 220 and 222 are preferably formed of a fluoroplastic material or the like to prevent adhesion of the adhesive of the tape.

Figure 21:
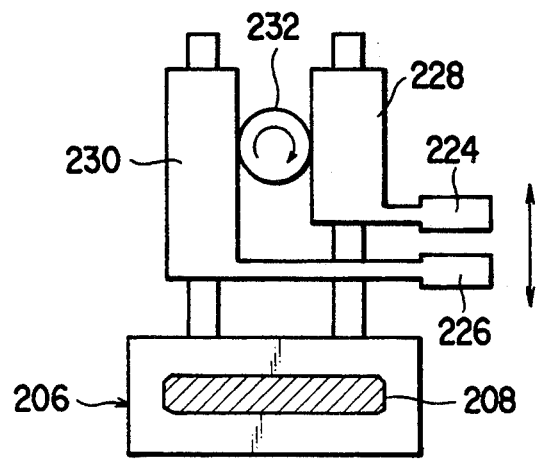
FIG. 21 is a view showing an opening/closing operation of a clamp of a shuttle of the film pasting unit.

FIG. 21 shows the shuttle 206 in detail. When a ring 232 is rotated, clamp holding members 228 and 230 are vertically moved to open and close a clamp. The clamp is constituted by upper and lower clamp pieces 224 and 226 connected to the holding members 228 and 230.

Figure 22:
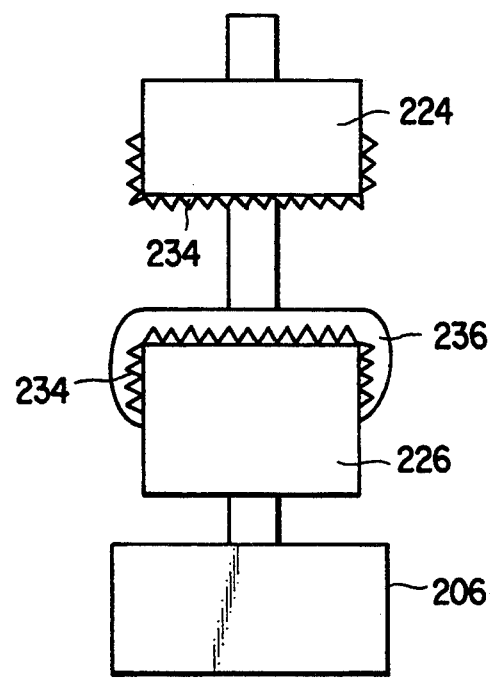
FIG. 22 is a sectional view showing the structure of the clamp.

FIG. 22 shows the arrangement of the clamp pieces 224 and 226. Nonslip members 234 which cause friction large enough to pull out a distal end of the tape from the continuous tape are formed on the surfaces of the upper and lower clamp pieces 224 and 226 such that the clamp pieces respectively have rugged surfaces. In addition, a non-adhesive material 236 consisting of a fluoro-plastic or the like, to which the adhesive surface of the tape does not adhere, is coated on the surface of the lower clamp piece 226, which is brought into contact with the adhesive surface of the tape, so as to cover the rugged surface of the nonslip member 234. With this structure, a tape can be reliably clamped, and at the same time the piece of tape can be smoothly transferred from the clamps 220 and 222 to the pasting head 202.

Figure 20A:
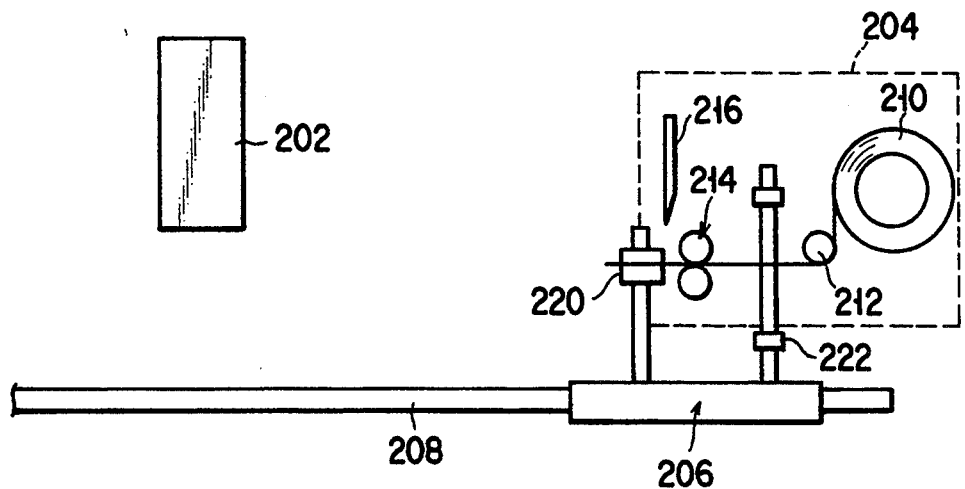
FIGS. 20A, 20B, and 20C are views showing an operation of the film pasting unit.

In the initial state, as shown in FIG. 20A, the shuttle 206 is located at the initial position on the tape cassette 204 side, and the clamp 220 is closed to clamp the distal end of the tape protruding from the roller pair 214. At this time, the clamp 222 is open and hence does not clamp the tape.

Figure 20B:
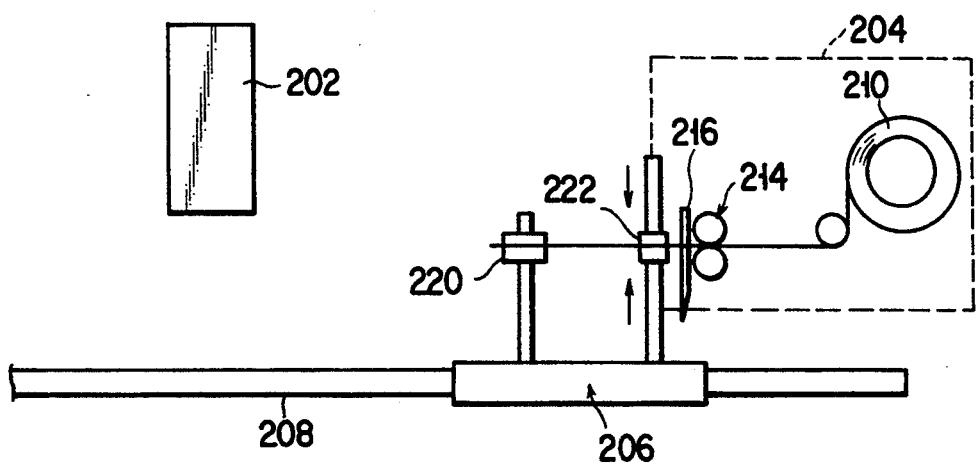

Subsequently, as shown in FIG. 20B, when the shuttle 206 is moved toward the head 202, and the clamp 222 is moved astride the roller pair 214, the shuttle 206 is temporarily stopped, and the clamp 222 is closed to clamp the tape 210. This position of the shuttle 206 is assumed to be a cutting position. The cutter 216 is then lowered to cut the tape between the clamp 222 and the roller pair 214. With this operation, a piece of tape having a length corresponding to the distance between the clamps 220 and 222 is cut from the tape cassette 204.

Figure 20C:
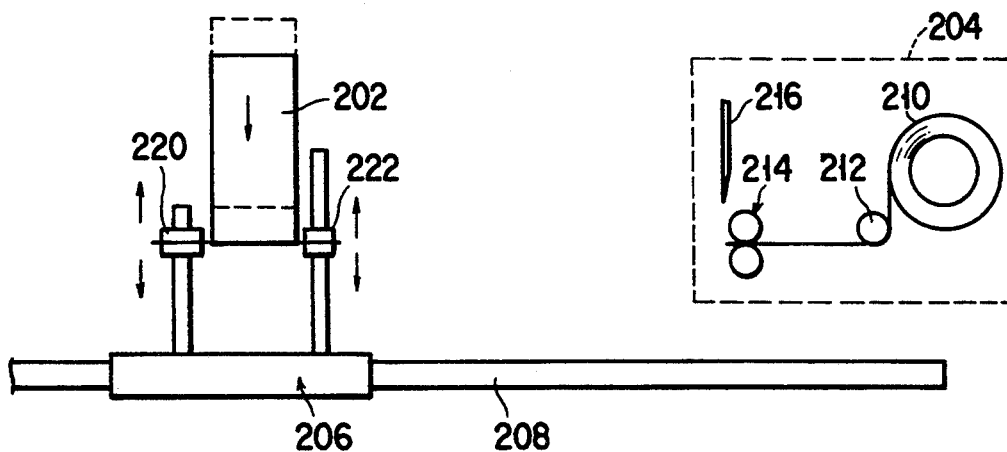

While this piece of tape is clamped by the clamps 220 and 222, the shuttle 206 is further moved toward the head 202, as shown in FIG. 20C. At this time the head 202 is located at an upper position so as not to interfere with the passage of the shuttle 206 (the clamps 220 and 222). When the shuttle 206 is moved to a position immediately below one of the heads 202, the movement of the shuttle 206 is stopped, and the head 202 is lowered. A large number of suction holes are formed in the lower surface of the head 202 to draw the peace of tape by suction. When the head 202 is lowered, the clamps 220 and 222 are opened, and the piece of tape is drawn to the lower surface of the head 202 by suction. At this time, in order to reliably transfer the piece of tape from the clamps 220 and 222 to the head 202, the head 202 is moved downward to a position lower than the position of the piece of tape clamped by the clamps 220 and 222 to press the tape before the clamps 220 and 222 are opened. Thereafter, the head 202 is moved upward, and the shuttle 206 returns to the initial position shown in FIG. 20A, thus supplying a piece of tape to another head. Note that the lower surface of the head 202 is preferably constituted by an elastic member such as a rubber member in order to reliably paste the piece of tape on a base film.

FIG. 23 is a block diagram showing the overall arrangement of the apparatus. A power supply is connected to a control unit 328 and a vacuum unit 330. A control unit 328 for on/off-controlling a valve unit 332 supplies control signals to a tray unit 300, a Z table unit 322, a film pasting unit 321, a θ table unit 326, a vacuum unit 330, and the valve unit 332. The vacuum unit 330 includes a vacuum pump for drawing a base film, a color separation film, a piece of tape, and the like by suction, and its control circuit. The valve unit 332 includes an electromagnetic valve for controlling the air cylinder, an electromagnetic valve for controlling suction, and the like. Air is supplied from the vacuum unit 330 to the vacuum unit 330, the tray unit 300, the Z table unit 322, the film pasting unit 324, and the θ table unit 326 through the valve unit 332. A beam sensor 336 is connected to an operation panel 334. The operation panel 334 is connected to the control unit 328 and the vacuum unit 330.

Figure 24B:
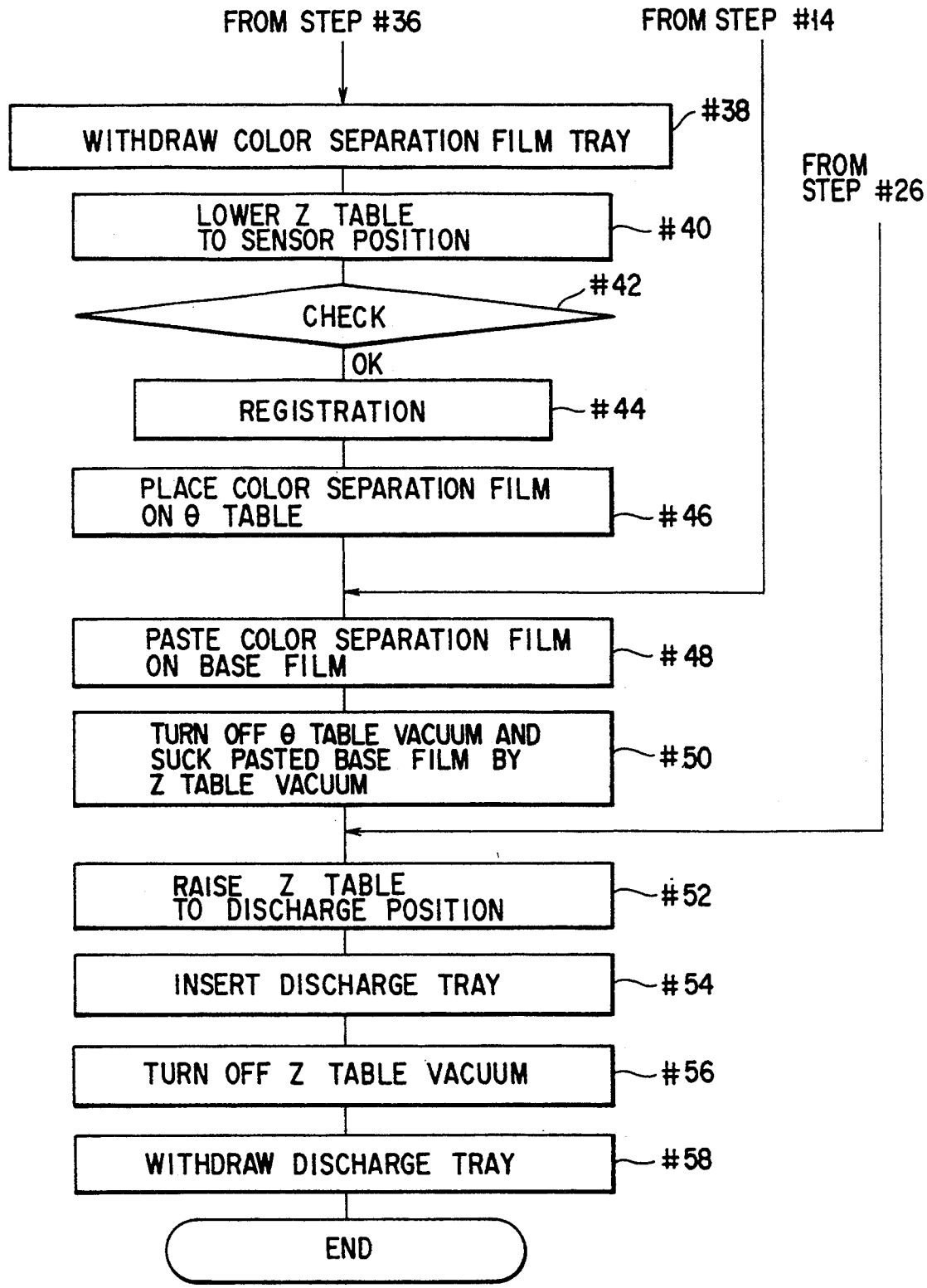
Figure 25A:
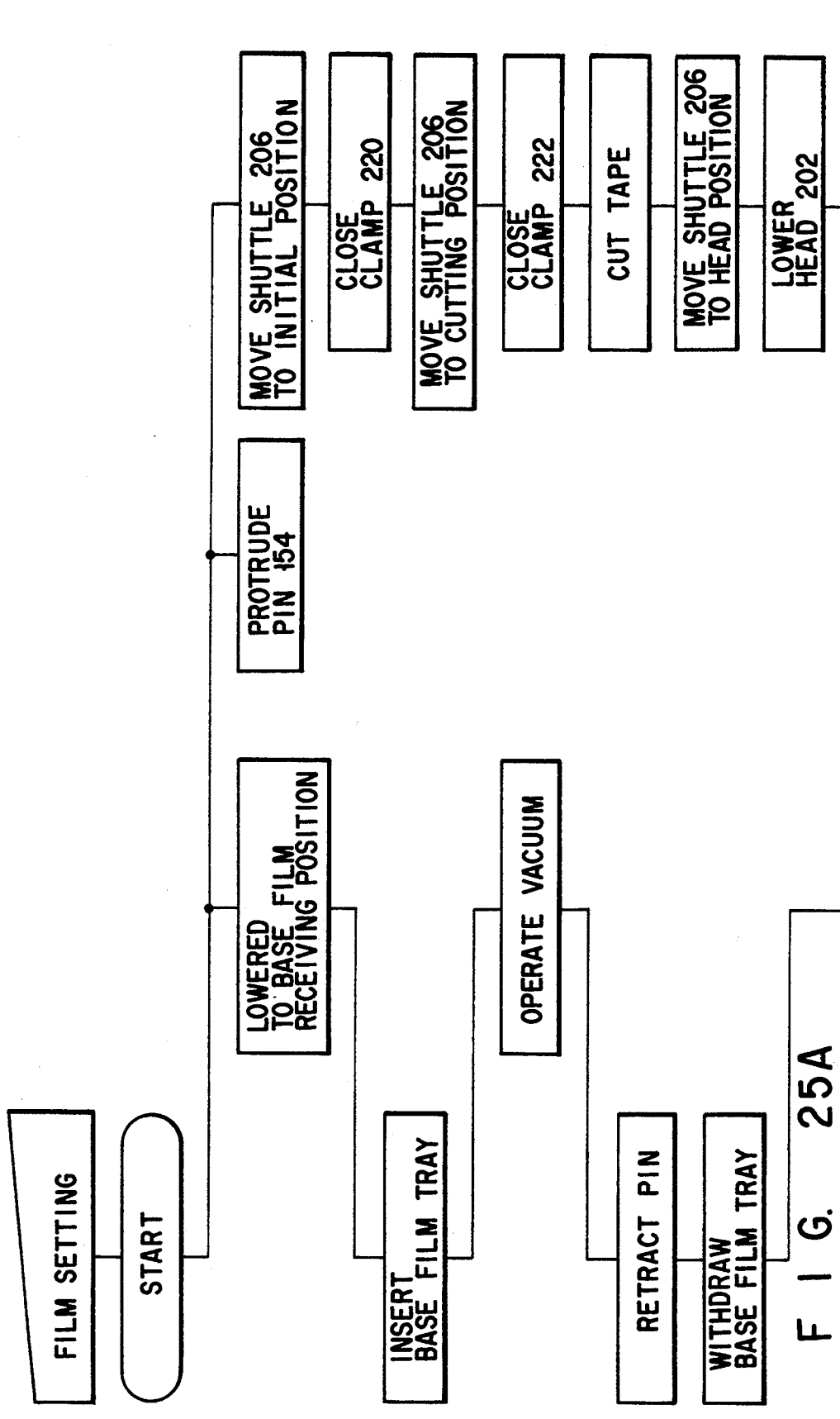
FIGS. 25A, 25B, 25C, and 25D show respective operations of a tray unit, the upper table, the lower table, and the film pasting unit in correspondence with the flow charts shown in FIGS. 24A and 24B.
Figure 25B:
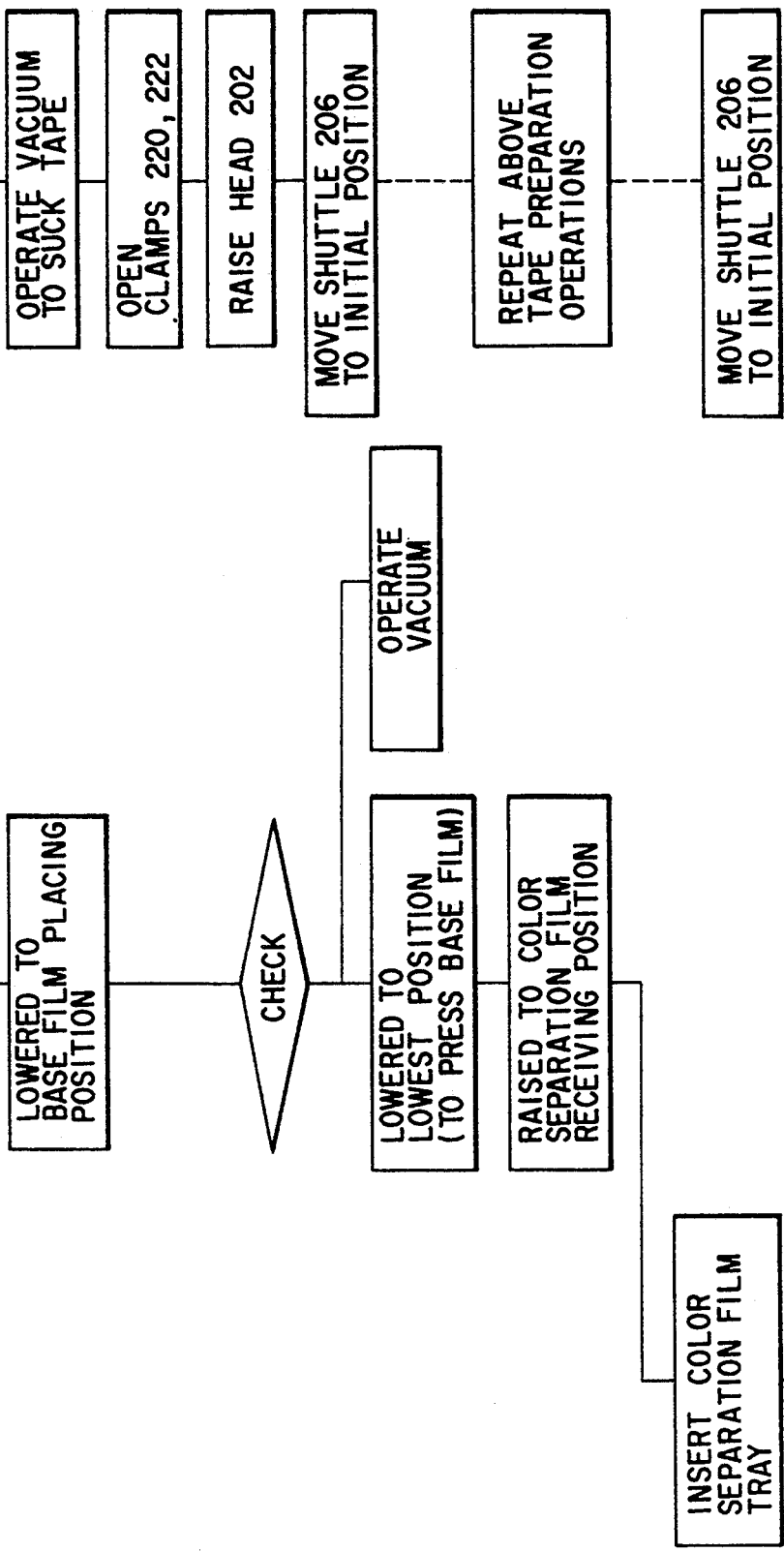
Figure 25C:
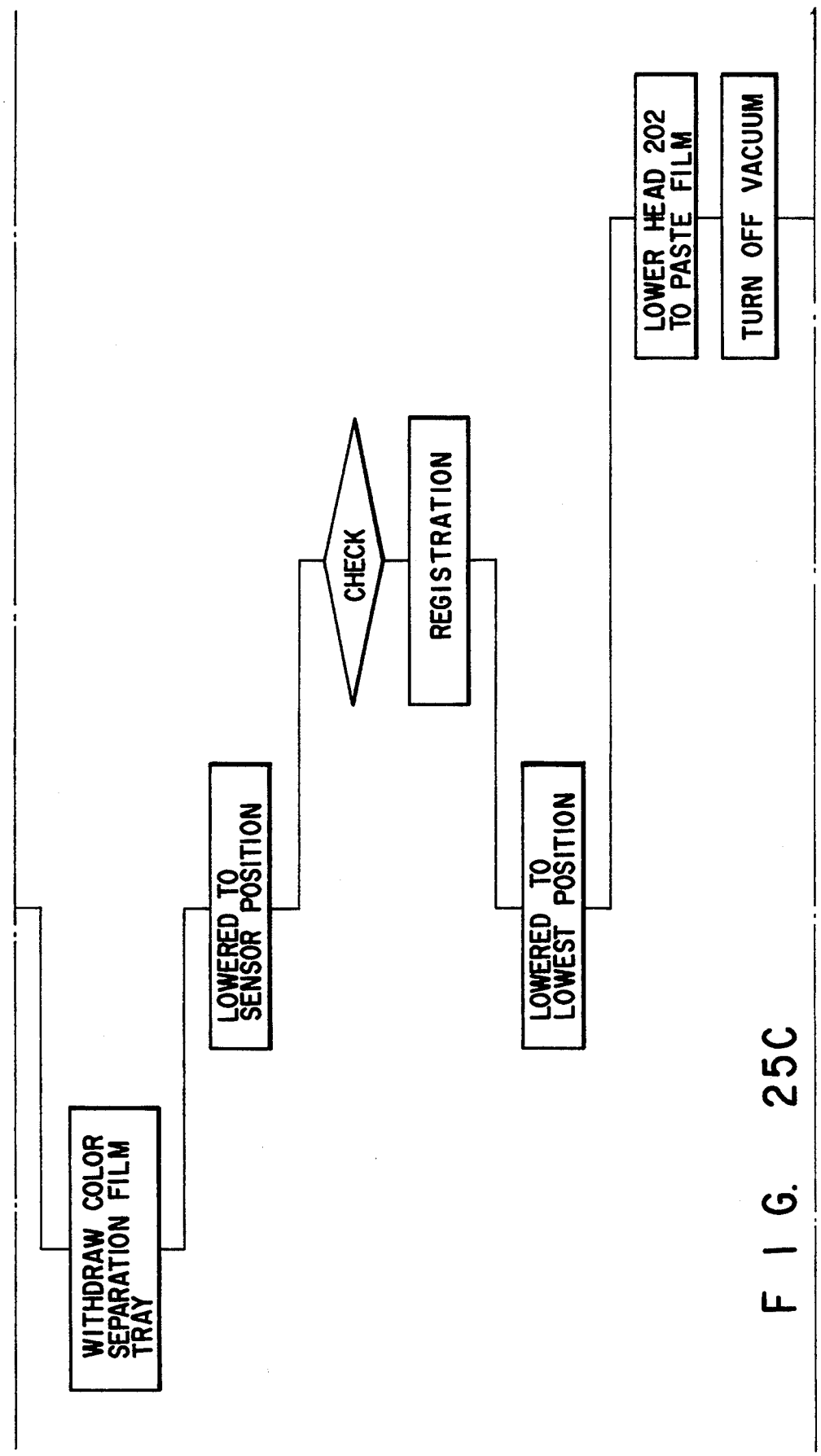
Figure 25D:
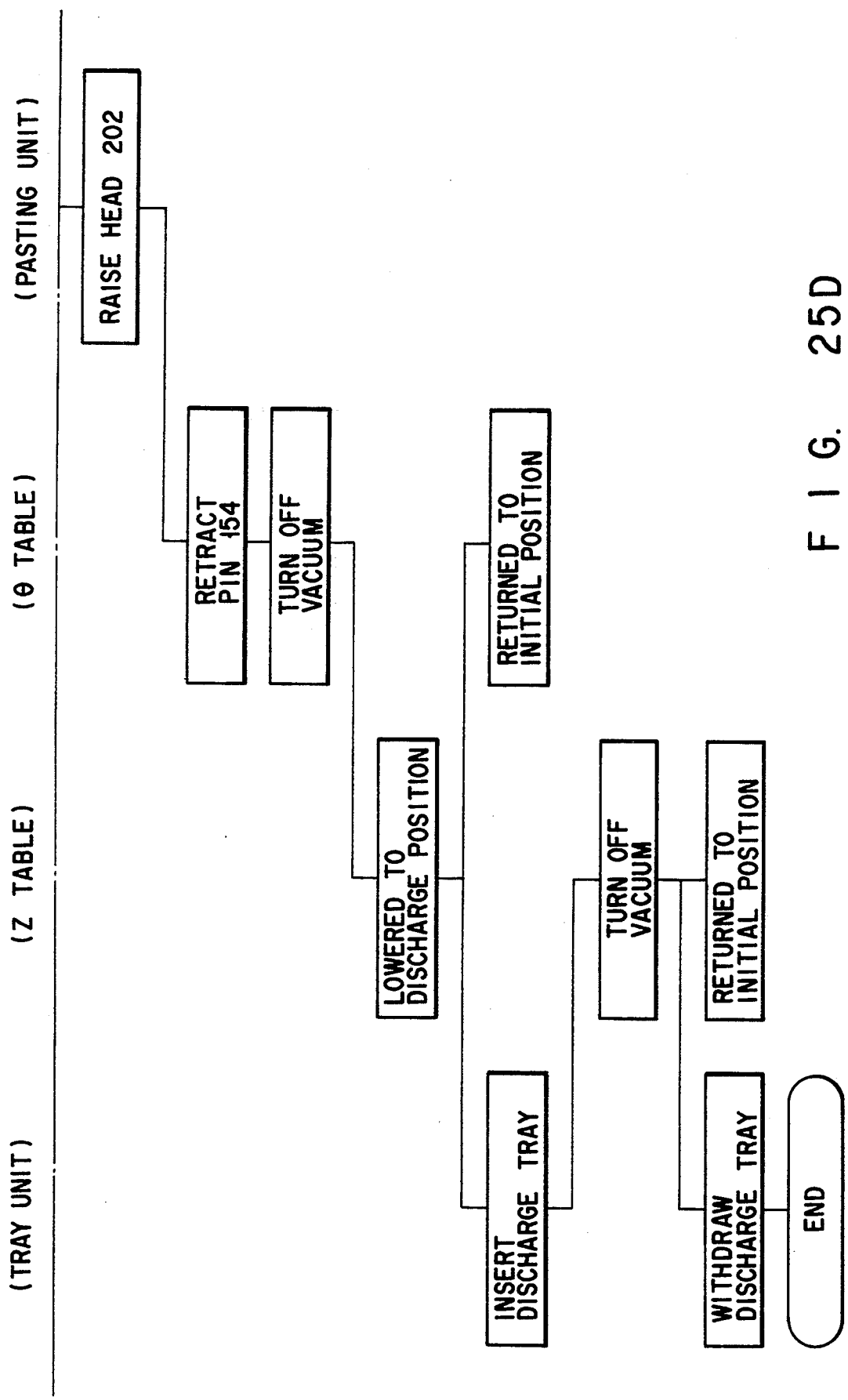

An operation of the embodiment will be described below with reference to the flow charts shown in FIGS. 24A and 24B. In the tray unit 16, color separation films corresponding to one original are set in the color separation film trays 24 and 28 in a predetermined order, and corresponding base films are set in the base film trays 26 and 30. As described above, each color separation film tray has a size large enough to store a color separation film of the maximum size (corresponding to a double-page spread of a newspaper). If only a color separation film corresponding to one page is to be set, it is set on one side in a tray which corresponds to the page by using the separators 40. If a color separation film corresponding to 15 columns or less is to be set, it is set in the corresponding region by using the film pressing plates 44. Pin holes are formed in each base film, and corresponding pins are formed in each base film tray. The base film is positioned with respect to the pins and set in the tray.

When an operation start is designated by operating the key switch device 12, the contents of trays are checked in step #10. In this step, the size and location of a color separation film are checked. The result of this check is used to determine a tape pasting position in a later tape preparation process or the like. In addition, the presence/absence of a base film in the discharge tray 32, which has undergone a tape pasting process is detected in this step. If any base film which has undergone a tape pasting process is left in the discharge tray 32 when base films and color separation films are set in the trays, a warning is generated.

In step #12, the Z table 20 is lowered to a base film receiving position. The base film receiving position is a position of the Z table 20 at which a base film is transferred from the tray 26 or 28 to the Z table 20. At this time, the pins for registration the base film extend upward from the θ table 22.

In parallel with operations in step #12 and the subsequent steps, the tape preparation process shown in FIGS. 20A to 20C is performed in step #14. The film pasting unit in each column has four tape pasting positions and the pasting heads 202 at the respective positions. Of these pasting heads 202, three heads are selected in accordance with the size of a color separation film. Each film pasting unit cuts pieces of tape from the continuous tape 210 of the tape cassette 204 and supplies them to the selected heads. The heads 202 draw the pieces of tape by suction and wait for a film pasting process. Since the tape preparation is performed while the films are picked from the trays, all the pieces of tape are simultaneously pasted on the film after the registration of the color separation film so that the time for requiring the film pasting is shortened.

In step #16, the base film tray 26 or 30 is inserted into the apparatus main body and is moved between the Z table 20 and the θ table 22. When the insertion of the base film tray is completed, the vacuum unit of the Z table 20 is operated in step #18 to cause the rear end portion of the base film to be drawn first to the Z table 20 by suction. Even if a plurality of base films are drawn to the Z table by suction, the second and subsequent films are stripped from the Z table owing to the function of the elastic member 64 formed on the rear end portion of the tray. At this time, the pins in the base film tray are lowered and retracted into the tray to allow the base film to be easily picked from the tray.

In step #20, the Z table 20 is finely moved up and down while only the rear end portion of the base film is drawn to the Z table 20 by suction. With this operation, even if a plurality of base films drawn to the Z table 20 by suction cannot be stripped from the table by the elastic member 64, the second and subsequent films can be reliably dropped by the swinging motion. As a result, only one base film can be reliably drawn to the Z table 20 by suction.

In step #22, the base film tray is returned to the initial position. At this time, as shown in FIG. 15B, the base film is pressed by the roller 66 to be completely drawn to the Z table 20 by suction.

After this operation, the registration pins in the base film tray extend upward again, and the Z table 20 is moved (lowered) to a sensor position in step #24.

In step #26, the θ table 22 reads the identification marks on the base film drawn to the Z table 20 by suction to check whether the upper and lower surfaces of the base film are properly located and the base film pattern is correct. If YES is obtained in step #26, the vacuum unit of the θ table 22 is operated in step #28. At the same time, the Z table 20 is moved downward to the lowest point to press the base film against the θ table 22. With this operation, the base film is picked from the base film tray and is placed at a predetermined position on the θ table 22. The placed base film is drawn by the vacuum unit of the θ table 22 to be fixed to the table.

If NO is obtained in step #26, step #52 is executed to discharge the base film. In parallel with the operations described above, each film pasting unit performs a preparation for a film pasting process, i.e., cutting pieces of tape from the continuous tape and supplying them to the pasting heads. The prepared pieces of tape are directly pasted on the base film. As a result, the operator sees the base film on which the pieces of tape are directly pasted and hence can recognize that an error is determined in step #26.

In step #30, the Z table 20 is moved (raised) to a color separation film receiving position. The color separation film receiving position is a position of the Z table at which a color separation film is transferred from the tray 24 or 28 to the Z table 20.

In step #32, the color separation film tray 24 or 28 is inserted into the apparatus main body and is moved between the Z table 20 and the θ table 22. Similar to the case of the base film, in steps #34 to #38, a color separation film is picked from the tray, and the film is pressed by the roller 66 upon return of the tray to the initial position so as to be drawn to the Z table 20 by suction.

In step #40, the Z table 20 is lowered to the sensor position. In step #42, the registration marks on the color separation film are detected by the optical sensors disposed in the θ table 22 to check a registration error of the color separation film and obtain amounts of registration θ, x, and y for the color separation film, based on the principle shown in FIGS. 7 to 10. If NO is obtained in step #42, the color separation film is returned in the color separation film tray. In step #44, registration between the respective color separation films is performed. Note that it is checked on the basis of the identification marks whether the color, positions of upper and lower surfaces, page, and the like of the color separation film are correct. If an error is determined, the base film is discharged after the color separation film is returned into the color separation film tray. Positioning (registration) is performed by rotating and moving the θ table 22.

In step #46, the Z table 20 is moved downward to the lowest point. Here, since the vacuum unit of the θ table 22 is operated, the color separation film is transferred from the Z table 20 onto the base film on the θ table 22, and the color separation film is pressed against the base film on the θ table 22.

In the film pasting units, pieces of tape have been supplied to the respective heads 202 by the opening/closing operations of the clamps 220 and 222 of the shuttles 206, the moving operations of the shuttles 206, the operations of the vacuum units of the heads 202, and the like, as shown in FIGS. 20A to 20C, up to this time. More specifically, each shuttle 206 is moved to the initial position, and the clamp 222 is closed to clamp the distal end of the tape. The shuttle 206 is moved to the cutting position (FIG. 20B), and the clamp 222 is closed to clamp the tape. The tape is then cut by the cutter 216 to form a piece of tape. The shuttle 206 is moved to the head position (FIG. 20C). Thereafter, the head 202 is lowered, and the vacuum unit of the head is operated. The clamps 220 and 222 are opened to cause the piece of tape to be drawn to the lower surface of the head 202. Subsequently, the shuttle 206 is returned to the initial position, and the same operation is repeated a number of times corresponding to the number of heads required for a pasting process.

After the Z table 20 is moved downward to the lowest point, in step #48, all the tape pasting heads 202 are lowered to press the pieces of tape against the base film and the color separation film. When the heads 202 are raised after the vacuum unit of the head 202 is stopped, the color separation film is pasted on the base film.

In step #50, the base film registration pins of the θ table 22 are lowered and retracted into the table, and the vacuum unit of the θ table 22 is stopped. Since the Z table 20 is located at the lowest point at this time and the vacuum unit of the Z table 20 is kept operating, the base film which has undergone a film pasting process can be transferred from the θ table 22 to the Z table 20 by suction.

In step #52, the Z table 20 is raised to a discharge position. The discharge position is a position of the Z table 20 at which the base film which has undergone a film pasting process is transferred from the Z table 20 to the discharge tray 32. In step #54, the discharge tray 32 is inserted into the apparatus main body and is moved between the Z table 20 and the θ table 22.

In step #56, by stopping the operation of the vacuum unit of the Z table 20, the base film which has undergone a pasting process can be collected into the discharge tray 32. In step #58, the discharge tray 32 is withdrawn from the position between the Z table 20 and the θ table 22, a film pasting process for one base film is completed. In this case, when even one base film is discharged into the discharge tray 32, the CRT monitor 14 displays a message that the base film can be taken out from the discharge tray 32 in order to speed up the original plate film formation.

In this case, two pairs of trays are prepared. When one pair of trays is operated, the above-described operation is automatically repeated until all the base films and the color separation films in the trays run out. During this period, not only the other pair of trays but also the discharge tray of one pair cannot be operated (cannot be pulled out). If, however, at least one base film which has undergone a pasting process is to be taken out before a process for all the colors is completed, or a more urgent color separation film is to be pasted, an interruption button may be formed in the key switch device 12 so that the process can be stopped halfway by depressing the button. Note that if the interruption button is depressed, one base film processed halfway is discharged into the discharge tray 32, and the process is interrupted when the discharge tray returns to the initial position (shown in FIG. 2). In this state, the other pair of trays can be operated, or the color separation films in the previously operated trays can be replaced with different films and the trays can be operated again. Assume that the start and interruption keys are depressed in this order before the operation of the apparatus. In this case, if, for example, five base films and corresponding color separation films are set, the process is interrupted when a film pasting process for one base film is finished so that base films which have undergone a pasting process can be taken out one by one. In addition, a discharge key may be arranged in the key switch device 12 so that a film or base film processed halfway can be forcibly discharged by depressing the discharge key. In this case, prepared pieces of tape are also pasted on a base film and are recovered.

An operation of the tray unit, Z table, θ table, and film pasting unit corresponding to the above flow charts will be described with reference to FIGS. 25A to 25D. In the tray unit, base films are set in the base film trays 26 and 30, and color separation films corresponding to one original are set in the color separation film trays 24 and 28 in a predetermined order. Each film tray has a size enough to store a film of the largest size (a double-page spread of a newspaper). A film corresponding to only one page is set on a one-side portion of each tray which corresponds to the page. When an operation start is designed by operating a button, a switch, or the like, the Z table 20 is lowered to a base film receiving position, and the pins 154 for registration a base film extend upward from the θ table 22. Thereafter, the base film tray 26 or 30 is inserted between the Z table 20 and the θ table 22.

When the tray is completely inserted, the Z table 20 is lowered, and the vacuum unit is operated, and the base film is drawn by the suction pads 84, as shown in FIG. 15A. Subsequently, the pins of the base film tray are lowered and retracted into the tray to facilitate the process of picking a base film from the base film tray. When the base film tray is withdrawn from the position between the Z table and the θ table, the base film is drawn to the Z table 20 by suction, as shown in FIG. 15B.

Subsequently, the pins in the base film tray extend upward again, and at the same time the Z table 20 is lowered to the base film receiving position. The θ table 22 reads the identification marks on the base film to check whether the upper and lower surfaces of the base film are properly located and the base film pattern is correct. If YES is obtained in this step, the table vacuum unit of the θ table 22 is operated, and the Z table 20 is lowered to the lowest point to press the base film against the θ table 22. Thereafter, the Z table is raised to a film receiving position. With this operation, the base film is picked from the base film tray and is placed at a predetermined position on the θ table. The base film is then drawn and fixed to the θ table by suction through the table vacuum unit.

The color separation film tray 24 or 28 As inserted between the Z table and the θ table, and a color separation film is picked from the tray and is drawn to the Z table 20 by suction when the tray is withdrawn from the position between the Z table and the θ table in the same manner as in the case with the base film, as shown in FIGS. 15A and 15B. Note that each color separation film tray has a function of judging the size of a color separation film, i.e., whether it corresponds to 12 columns, 15 columns, or a double-page spread. After this operation, the Z table 20 is lowered to the sensor position. The registration marks 170a, 170b, . . . on of the film are detected by the optical sensors 172a, 172b, . . . arranged in the θ table 22 to check the misalignment of the color separation film and obtain the amounts of registration θ, x, and y of the color separation film. Note that it is checked on the basis of the identification marks whether colors, the positions of the upper and lower surfaces, page, and the like of the color separation film are correct. If NO is obtained in this step, a corresponding warning is given.

The Y table 134 and the Xθ table 136 are moved and rotated to perform registering of the color separation film. Thereafter, the Z table 20 is lowered to the lowest position.

The color separation film is transferred from the Z table 20 onto the base film on the θ table 22 by means of the suction force of vacuum unit of the θ table 22 and is pressed against the base film.

In the film pasting units, pieces of tape have been supplied to the respective heads by the opening/closing operations of the clamps 220 and 222 of the shuttles 206, the operations of the vacuum units of the heads, and the like, as shown in FIGS. 20A to 20C, up to this time. More specifically, the shuttle 206 is moved to the initial position (FIG. 20A), and the clamp 220 is closed to clamp the distal end of the tape. The shuttle 206 is then moved to the cutting position (FIG. 20B), and the clamp 222 is closed to clamp the tape. After the tape is cut by the cutter 216, the shuttle 206 is moved to the head position (FIG. 20C). The head is then lowered, and the vacuum unit in the head is operated. The clamps 220 and 222 are opened to allow the piece of tape to be drawn to the lower surface of the head. Thereafter, the shuttle 206 is returned to the initial position. The same operation is repeated a number of times corresponding to the number of heads required to paste the film.

After the Z table 20 is lowered to the lowest point, the tape pasting head 202 incorporated in the Z table 20 is lowered to paste the tape on the base film and the color separation film. After the head vacuum unit is stopped, the head 202 is moved upward, thereby pasting the color separation film on the base film.

The base film registration pins 154 of the θ table 22 are lowered and retracted into the table, and the table vacuum unit is stopped. At this time, when the Z table 20 is located at the lowest position, the base film which has undergone a film pasting operation can be drawn to the Z table 20 by means of the suction force of the vacuum unit of the Z table 20. The Z table 20 is then raised to the discharge position, and the discharge tray 32 is inserted between the Z table and the θ table. The θ table 22 is returned to the original position.

Subsequently, the table vacuum unit of the Z table 20 is stopped. As a result, the base film which has undergone a film pasting operation is discharged into the discharge tray 22. The discharge tray 22 is withdrawn from the position between the Z table and the θ table, and the operation is completed.

As described above, according to this embodiment, by only setting base films and color separation films in the corresponding trays, respectively, a base film and a color separation film can be automatically picked from the trays and placed on the lower table with registration, and the color separation film can be automatically pasted on the base film by the film pasting units incorporated in the upper table, thereby easily performing a high-precision film pasting operation without increasing a burden on an operator.

In addition, according to the this embodiment, two registration marks, each constituted by two line segments, are arranged on a color separation film such that the corresponding line segments of the marks are parallel to each other, and the positioning marks are detected by the sensors while the relative positions of the color separation film and the sensors are changed. With this operation, even if a color separation film is greatly shifted from the proper position, an amount of a positional shift can be detected, thus allowing a registration operation with respect to the color separation film.

Moreover, according to the film pasting unit of this embodiment, a tape is pulled out from the tape holder while the tape is clamped by the two clamps formed on the shuttle at a predetermined distance, the tape is cut on the rear side of the clamps, and the shuttle is conveyed to each pasting head while the piece of tape is clamped by the clamps, thereby supplying a piece of tape to each head. Therefore, each tap pasting unit has a simple arrangement.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, a base film need not be set in a tray but can be directly placed on the lower table. In addition, a negative film is used as a color separation film. However, a positive film may be used. Furthermore, color photographs for a newspaper and the like are exemplified as objects to be subjected to a photomechanical process. However, the present invention is not limited to them but can be applied to any color photographs as long as they are subjected to a photomechanical process. The angle defined by two line segments constituting each registration mark for detecting a positional shift is not limited to 90° but can be set to be any predetermined angle. Moreover, the shape of each registration mark is not limited to an L shape having two line segments connected each other, but any shape, e.g., a cross having two line segments crossing each other, may be employed as long as the corresponding line segments are parallel to each other.

As has been described above, according to the present invention, there is provided a film pasting apparatus wherein by only setting films on a film tray, each film can be automatically positioned, and a tape pasting operation can be automatically performed, thereby reducing the degree of fatigue felt by an operator, performing a high-precision film pasting operation in a short period of time, and efficiently forming a high-quality original plate film.

What is claimed is:

1. A film pasting apparatus for pasting a color separation film on a base film in a photomechanical process, comprising:
   a lower table on which a base film is placed, said lower table having optical sensors;
   an upper table disposed above said lower table and having suction means and pasting means;
   a color separation film tray for storing a color separation film on which a first registration mark having two line segments defining a predetermined angle and a second registration mark having two line segments parallel to the two line segments of the first registration mark are formed at positions corresponding to said sensors;
   film picking means for changing a positional relationship between said color separation film tray and said upper table to locate said color separation film tray at a position below said upper table and to draw the color separation film to said upper table by said suction means;
   film registering means for changing a positional relationship between said color separation film tray and said upper table to withdraw said color separation film tray from the position below said upper table and to detect the registration marks of the color separation film drawn to said upper table by using said sensors, for aligning a positional relationship between said upper table and said lower table based on a result of detection of the registration marks, and for placing the color separation film on the base film placed on said lower table; and
   means for operating said pasting means to paste the color separation film on the base film, said pasting means further including:
      means for holding a distal end portion of a tape supplied from a tape source provided on said upper table;

a shuttle member, capable of moving on said upper table, for supporting first and second clamps for clamping the distal end portion of the tape, the first and second clamps being separated from each other by a predetermined distance;

tape feed means for feeding the tape from said tape source by moving said shuttle member in a direction apart from the tape source by the predetermined distance with the first clamp clamping the distal end of the tape and the second clamp opening, stopping the shuttle when the second clamp passes through said holding means, and closing the second clamp to clamp the tape;

means for cutting the tape fed by said tape feed means at a position between said second clamp and said holding means; and means for transferring said shuttle member to a tape pasting head disposed at a predetermined position on said upper table and supplying the tape clamped by said first and second clamps to the tape pasting head.

2. An apparatus according to claim 1, wherein:
said film picking means comprises means for moving at least one of said upper table and said lower table in two directions included in a table plane to detect the registration marks by said sensors; and
said film registering means comprises means for aligning the positional relationship between said upper table and said lower table based on a timing at which said sensors detect the registration marks.

3. An apparatus according to claim 1, wherein:
said upper table is moved up and down;
said lower table is moved in two directions included in a table plane and rotated around a point in the table plane; and
said color separation film tray is inserted into an area between said upper table and said lower table and withdrawn from the area.

4. An apparatus according to claim 1, wherein:
said base film is stored in a base film tray;
a base film on which the color separation film is pasted is collected in a discharge tray; and
said base film tray, said color separation film tray, and said discharge tray are slidably supported by a first support member which is slidably supported by a second support, pulled out from said first support member when the base film and the color separation films are set in said base film tray and said color separation film tray and when the base film on which the color separation film is pasted is taken out from the discharge tray, and inserted inside the apparatus with the first support member when the base film and the color separation film are picked from said base film tray and said color separation film tray by said film picking means.

5. An apparatus according to claim 1, wherein:
said base film is stored in a base film tray;
bottom surfaces of a rear end portion of said base film tray and said color separation film tray are slightly higher than other portions such that the base film and the color separation film are first drawn to said upper table at the rear end portion; and
said base film tray and said color separation film tray each comprise an elastic member on the rear end portion so as to strip second and subsequent base and color separation films simultaneously drawn to said upper table.

6. An apparatus according to claim 1, wherein:
said base film is stored in a base film tray; and
said film picking means comprises means for moving said upper table up and down when said suction means picks the base film and the color separation film from said base film tray and said color separation film tray.

7. An apparatus according to claim 1, wherein said pasting means further comprises:
a tape cassette, detachably provided on said upper table, including a continuous tape and a cutter for cutting a piece of tape from the continuous tape;
a pasting head provided on said upper table for pressing the piece of tape against the base film and the color separation film through an opening provided in said upper table; and
a shuttle for feeding the piece of tape from said tape cassette to said pasting head.

8. An apparatus according to claim 1, wherein:
said base film is stored in a base film tray; and
said film picking means further comprises:
means for judging a match with respect to at least one of a size, a location, and a color between the base film and the color separation film by detecting an identification mark formed on the base film and the color separation film when the base film and the color separation film are picked from said base film tray and said color separation film tray; and
means for directly discharging the base film on which the color separation film is not pasted when a match is not detected.

9. An apparatus according to claim 1, wherein said color separation film tray further comprises:
film pressing plates disposed on a bottom surface at positions corresponding to lower ends of respective sizes of the color separation films.

10. An apparatus according to claim 1, wherein:
the base film has a size of a double-page spread of a printed material;
the color separation film has one of at least two sizes, one of which is a size of double-page spread of the printed material and another of which is a size of single page; and
said color separation film tray further includes a film separator disposed in the middle of a bottom surface, the separator including a projection having a substantially S-shaped cross section, the separator being rotated to retract the projection into the bottom surface when a color separation film having a double-page size is set into said color separation film tray.

11. An apparatus according to claim 1, wherein said suction means comprises:
a suction pad for drawing the color separation film by suction, and a plug member shaped to provide an air path, inserted into the suction pad, an insertion depth of the plug member being adjusted for adjusting suction strength.

12. An apparatus according to claim 1, wherein:
said base film is stored in a base film tray;
a plurality of groups of said base film tray and said color separation film tray are provided, one of the groups being selectively operated; and
sensor means for detecting an approach of an operator to a front portion of said color separation film tray and said base film tray are provided for all of said color separation film trays and said base film trays, only the sensor means provided for the group of said base film tray and said color separation film tray operated being selectively operated.

13. A film pasting apparatus for pasting a color separation film on a base film in a photomechanical process, comprising:
   a lower table on which a base film is placed, said lower table having optical sensors;
   an upper table disposed above said lower table and having suction means and pasting means;
   a color separation film tray for storing a color separation film on which a first registration mark having two line segments defining a predetermined angle and a second registration mark having two line segments parallel to the two line segments of the first registration mark are formed at positions corresponding to said sensors;
   film picking means for changing a positional relationship between said color separation film tray and said upper table to locate said color separation film tray at a position below said upper table and to draw the color separation film to said upper table by said suction means;
   film registering means for changing a positional relationship between said color separation film tray and said upper table to withdraw said color separation film tray from the position below said upper table and to detect the registration marks of the color separation film drawn to said upper table by using said sensors, for aligning a positional relationship between said upper table and said lower table based on a result of detection of the registration marks, and for placing the color separation film on the base film paced on said lower table; and
   means for operating said pasting means to paste the color separation film on the base film, said pasting means further including:
      a cutter for cutting a piece of tape from a continuous tape;
      a pasting head for pressing the piece of tape against the base film through an opening provided in said upper table; and
      a shuttle for feeding the piece of tape from the tape cassette to the pasting head, the shuttle having a pair of clamps for clamping the piece of tape, and means for moving the head up and down and for opening the pair of clamps when the piece of tape is fed to the head from the shuttle.

14. An apparatus according to claim 13, wherein:
   said film picking means comprises means for moving at least one of said upper table and said lower table in two directions included in a table plane to detect the registration marks by said sensors; and
   said film registering means comprises means for aligning the positional relationship between said upper table and said lower table based on a timing at which said sensors detect the registration marks.

15. An apparatus according to claim 15, wherein:
   said upper table is moved up and down;
   said lower table is moved in two directions included in a table plane and rotated around a point in the table plane; and
   said color separation film tray is inserted into an area between said upper table and said lower table and withdrawn from the area.

16. An apparatus according to claim 13, wherein:
   said base film is stored in a base film tray;
   a base film on which the color separation film is pasted is collected in a discharge tray; and
   said base film tray, said color separation film tray, and said discharge tray are slidably supported by a first support member which is slidably supported by a second support, pulled out from said first support member when the base film and the color separation films are set in said base film tray and said color separation film tray and when the base film on which the color separation film is pasted is taken out from the discharge tray, and inserted inside the apparatus with the first support member when the base film and the color separation film are picked from said base film tray and said color separation film tray by said film picking means.

17. An apparatus according to claim 13, wherein:
   said base film is stored in a base film tray;
   bottom surfaces of a rear end portion of said base film tray and said color separation film tray are slightly higher than other portions such that the base film and the color separation film are first drawn to said upper table at the rear end portion; and
   said base film tray and said color separation film tray each comprise an elastic member on the rear end portion so as to strip second and subsequent base and color separation films simultaneously drawn to said upper table.

18. An apparatus according to claim 13, wherein:
   said base film is stored in abase film tray; and
   said film picking means comprises means for moving said upper table up and down when said suction means picks the base film and the color separation film from said base film tray and said color separation film tray.

19. An apparatus according to claim 13, wherein said pasting means further comprises:
   a tape cassette, detachably provided on said upper table, including a continuous tape and a cutter for cutting a piece of tape from the continuous tape;
   a pasting head provided on said upper table for pressing the piece of tape against the base film and the color separation film through an opening provided in said upper table; and
   a shuttle for feeding the piece of tape from said tape cassette to said pasting head.

20. An apparatus according to claim 13, wherein:
   said base film is stored in a base film tray; and
   said film picking means further comprises:
      means for judging a match with respect to at least one of a size, a location, and a color between the base film and the color separation film by detecting an identification mark formed on the base film and the color separation film when the base film and the color separation film are picked from said base film tray and said color separation tray; and
      means for directly discharging the base film on which the color separation film is not pasted when a match is not detected.

21. An apparatus according to claim 13, wherein said color separation film tray further comprises:
   film pressing plates disposed on a bottom surface at positions corresponding to lower ends of respective sizes of the color separation films.

22. An apparatus according to claim 13, wherein:
   the base film has a size of a double-page spread of a printed material;
   the color separation film has one of at least two sizes, one of which is a size of double-page spread of the printed material and another of which is a size of single page; and said color separation film tray further includes a film separator disposed in the middle of a bottom surface, the separator including a projection having a substantially S-shaped cross section, the separator being rotated to retract the projection into the bottom surface when a color separation film having a double-page size is set into said color separation film tray.

23. An apparatus according to claim 13, wherein said suction means further comprises:

a suction pad for drawing the color separation film by suction, and a plug member shaped to provide an air path, inserted into the suction pad, an insertion depth of the plug member being adjusted for adjusting suction strength.

24. An apparatus according to claim 13, wherein:

said pair of clamps are covered by a nonslip material with a rugged surface and a non-adhesive material coating on the surface of the nonslip material on one of the pair of clamps which is brought into contact with an adhesive surface of the tape.

25. An apparatus according to claim 13, wherein:

said base film is stored in a base film tray;

a plurality of groups of said base film tray and said color separation film tray are provided, one of the groups being selectively operated; and sensor means for detecting an approach of an operator to a front portion of said color separation film tray and said base film tray are provided for all of said color separation film trays and said base film trays, only the sensor means provided for the group of said base film tray and said color separation film tray operated being selectively operated.

26. A film pasting apparatus for pasting a color separation film on a base film in a photomechanical process, comprising:

a lower table on which a base film is placed, said lower table having optical sensors at predetermined positions;

an upper table disposed above said lower table and having suction means and pasting means;

a color separation film tray for storing a color separation film on which a first registration mark having two line segments defining a predetermined angle and a second registration mark having two line segments parallel to the two line segments of the first registration mark are formed at two corners, the color separation film tray having film pressing plates disposed on a bottom surface at positions corresponding to lower ends of plural sizes of the color separation film, respectively;

film picking means for changing a positional relationship between said color separation film tray and said upper table to locate said color separation film tray at a position below said upper table and to draw the color separation film to said upper table by said suction means;

film registering means for changing a positional relationship between said color separation film tray and said upper table to withdraw said color separation film tray from the position below said upper table and to detect the registration marks of the color separation film drawn to said upper table by using said sensors, for aligning a positional relationship between said upper table and said lower table based on a result of detection of the registration marks, and for placing the color separation film on the base film placed on said lower table; and means for operating said pasting means to paste the color separation film on the base film.

27. An apparatus according to claim 26, wherein said pasting means further comprises:

means for holding a distal end portion of a tape supplied from a tape source provided on said upper table;

a shuttle member, capable of moving on said upper table, for supporting first and second clamps for clamping the distal end portion of the tape, the first and second clamps being separated from each other by a predetermined distance;

tape feed means for feeding the tape from said tape source by moving said shuttle member in a direction apart from the tape source by the predetermined distance with the first clamp clamping the distal end of the tape and the second clamp opening, stopping the shuttle when the second clamp passes through said holding means, and closing the second clamp to clamp the tape;

means for cutting the tape fed by said tape feed means at a position between said second clamp and said holding means; and means for transferring said shuttle member to a tape pasting head disposed at a predetermined position on said upper table and supplying the tape clamped by said first and second clamps to the tape pasting head.

28. An apparatus according to claim 26, wherein:

said base film is stored in a base film tray;

a base film on which the color separation film is pasted is collected in a discharge tray; and said base film tray, said color separation film tray, and said discharge tray are slidably supported by a first support member which is slidably supported by a second support, pulled out from said first support member when the base film and the color separation films are set in said base film tray and said color separation film tray and when the base film on which the color separation film is pasted is taken out from the discharge tray, and inserted inside the apparatus with the first support member when the base film and the color separation film are picked from said base film tray and said color separation film tray by said film picking means.

29. An apparatus according to claim 26, wherein:

said base film is stored in a base film tray;

bottom surfaces of a rear end portion of said base film tray and said color separation film tray are slightly higher than other portions such that the base film and the color separation film are first drawn to said upper table at the rear end portion;

said base film tray and said color separation film tray each comprise an elastic member on the rear end portion so as to strip second and subsequent base and color separation films simultaneously drawn to said upper table; and said film picking means further includes means for moving said upper table up and down when said suction means picks the base film and the color separation film from said base film tray and said color separation film tray.

30. An apparatus according to claim 26, wherein said pasting means further comprises:

a tape cassette, detachably provided on said upper table, including a continuous tape and a cutter for cutting a piece of tape from the continuous tape;

a pasting head provided on said upper table for pressing the piece of tape against the base film and the color separation film through an opening provided in said upper table; and a shuttle for feeding the piece of tape from said tape cassette to said pasting head.

31. An apparatus according to claim 26, wherein:

said base film is stored in a base film tray; and said film picking means further comprises:
 means for judging a match with respect to at least one of a size, a location, and a color between the base film and the color separation film by detecting an identification mark formed on the base film and the color separation film when the base film and the color separation film are picked from said base film tray and said color separation film tray; and
 means for directly discharging the base film on which the color separation film is not pasted when a match is not detected.

32. An apparatus according to claim 26, wherein:

the base film has a size of a double-page spread of a printed material;

the color separation film has one of at least two sizes, one of which is a size of double-page spread of the printed material and another of which is a size of single page; and said color separation film tray further includes a film separator disposed in the middle of a bottom surface, the separator including a projection having a substantially S-shaped cross section, the separator being rotated to retract the projection into the bottom surface when a color separation film having a double-page size is set into said color separation film tray.

33. An apparatus according to claim 26, wherein said pasting means further comprises:

a cutter for cutting a piece of tape from a continuous tape;

a pasting head for pressing the piece of tape against the base film through an opening provided in said upper table; and a shuttle for feeding the piece of tape from the tape cassette to the pasting head, the shuttle having a pair of clamps for clamping the piece of tape, and means for moving the head up and down, and for opening the pair of clamps when the piece of tape is fed to the head from the shuttle.

34. An apparatus according to claim 33, wherein:

said pair of clamps are covered by a nonslip material with a rugged surface and a non-adhesive material coating on the surface of the nonslip material on one of the pair of clamps which is brought into contact with an adhesive surface of the tape.

35. An apparatus according to claim 26, wherein:

said base film is stored in a base film tray;

a plurality of groups of said base film tray and said color separation film tray are provided, one of the groups being selectively operated; and sensor means for detecting an approach of an operator to a front portion of said color separation film tray and said base film tray are provided for all of said color separation film trays and said base film trays, only the sensor means provided for the group of said base film tray and said color separation film tray operated being selectively operated.

* * * * *